US010514883B2

(12) United States Patent
Rossum

(10) Patent No.: US 10,514,883 B2
(45) Date of Patent: Dec. 24, 2019

(54) MULTI-CHANNEL MORPHING DIGITAL AUDIO FILTER

(71) Applicant: Rossum Electro-Music, LLC, Aptos, CA (US)

(72) Inventor: David Rossum, Santa Cruz, CA (US)

(73) Assignee: Rossum Electro-Music, LLC, Santa Cruz, CA (US)

( * ) Notice: Subject to any disclaimer, the term of this patent is extended or adjusted under 35 U.S.C. 154(b) by 0 days.

(21) Appl. No.: 15/901,808

(22) Filed: Feb. 21, 2018

(65) Prior Publication Data

US 2018/0239578 A1 Aug. 23, 2018

Related U.S. Application Data

(60) Provisional application No. 62/462,703, filed on Feb. 23, 2017.

(51) Int. Cl.
G06F 17/00 (2019.01)
G06F 3/16 (2006.01)
(Continued)

(52) U.S. Cl.
CPC ............. *G06F 3/16* (2013.01); *G10H 1/0091* (2013.01); *H03H 17/0294* (2013.01)

(58) Field of Classification Search
CPC ... G06F 3/16; H04R 3/04; G10H 1/06; G10H 1/125; G10H 1/12; G10H 1/16;
(Continued)

(56) References Cited

U.S. PATENT DOCUMENTS 4,180,707 A * 12/1979 Moog ...................... H03F 1/327
381/106
5,157,623 A * 10/1992 Hayashi .................. G06F 17/17
708/313

(Continued)

OTHER PUBLICATIONS

Massie, Dana, "Coefficient Interpolation for the Max Mathews Phasor Filter," (AES Convention Papers, 113rd Convention, 2012), 8 pages.

(Continued)

*Primary Examiner* — Fan S Tsang
*Assistant Examiner* — David Siegel
(74) *Attorney, Agent, or Firm* — Carr & Ferrell LLP

(57) ABSTRACT

The present disclosure provides a multi-channel morphing digital audio filter, including methods and systems for real-time interpolation between a plurality of fixed frequency responses. Real-time interpolation may be performed simultaneously along three separate axes. Various embodiments of the present technology include receiving, in real-time via a digital filter module, at least one acoustic signal and one or more control input signals indicative of one or more corresponding interpolator values. The methods and systems may further include determining one or more filter coefficients based on a linear interpolation in an encoded space of a plurality of fixed frequency responses, generating a filter from the one or more determined filter coefficients, and applying the generated filter to the at least one received acoustic signal. In some embodiments, frequency and amplitude (i.e., angle and radius) of poles and zeros of the filters may be processed independently, and poles may be unconditionally stable.

20 Claims, 14 Drawing Sheets

(51) Int. Cl.
 *G10H 1/00* (2006.01)
 *H03H 17/02* (2006.01)

(58) Field of Classification Search
 CPC ....... G10H 2210/031; G10H 2210/136; G10H 2210/155; G10H 2210/195; G10H 2210/235; G10H 2210/265; G10H 2210/271; G10H 2250/055; G10H 2250/061; G10H 2250/065; G10H 2250/071; G10H 2250/121; G10H 2250/075; G10H 2250/081; G10H 2250/085; G10H 2250/091; G10H 2250/095; G10H 2250/101; G10H 2250/105

See application file for complete search history.

(56) References Cited

U.S. PATENT DOCUMENTS

| 5,170,369 | A | 12/1992 | Rossum | |
|---|---|---|---|---|
| 6,504,935 | B1* | 1/2003 | Jackson | G10H 1/125 381/61 |
| 6,664,460 | B1* | 12/2003 | Pennock | G10H 1/0091 381/118 |
| 2009/0164905 | A1* | 6/2009 | Ko | H04M 1/6016 715/727 |

OTHER PUBLICATIONS

Rossum, Dave, "The 'ARMAdillo' Coefficient Encoding Scheme for Digital Audio Filters", IEEE ASSP Workshop on Applications of Signal Processing to Audio and Acoustics, Oct. 1991, 8 pages.
Rossum, Dave, "Making digital filters sound 'analog'", International Computer Music Association, vol. 1992, 1992, pp. 30-33.

* cited by examiner

MULTI-CHANNEL MORPHING DIGITAL AUDIO FILTER

CROSS-REFERENCE TO RELATED APPLICATION

The present application claims the benefit of U.S. Provisional Patent Application No. 62/462,703, filed Feb. 23, 2017. The subject matter of the aforementioned application is incorporated herein by reference for all purposes.

FIELD

The present technology relates generally to audio processing, and more particularly to a multi-channel morphing digital audio filter for real-time interpolation between a plurality of fixed frequency responses.

BACKGROUND

Many electronic instruments involve the technology of sampling, where sounds are digitally recorded and played back at different pitches. Sampling has the advantage of highly accurate and realistic sound. Once the sounds are recorded, however, it is difficult to change them in any significant way.

Traditionally, dynamic digital filtering for audio signals has included controlling a frequency response of an applied filter. As has been previously disclosed in U.S. Pat. No. 5,170,639, entitled "Dynamic Digital IIR Audio Filter and Method Which Provides Dynamic Digital Filtering for Audio Signals" issued Dec. 8, 1992 by the same inventor, incorporated by reference herein, one technique includes reducing the required multiplier coefficient size and allowing the fixing of a direct current gain of an infinite impulse response filter. Furthermore, music synthesizers released by E-mu Systems, Inc., including MORPHEUS and ULTRAPROTEUS, provided the ability to smoothly change a filter function over time. However, conventional systems were unable to provide an unconditionally stable filter structure or morph in multiple axes in real-time. Furthermore, traditionally the pole and zero frequency and amplitude have not been completely independent, which may cause undesirable interaction. While the basis of morphing a digital audio filter has been previously described, there are several improvements beyond the traditional music synthesizers, which are described herein. As such, a long felt need exists to provide improved dynamic digital filtering for audio signals to address one or more of these limitations.

SUMMARY

This summary is provided to introduce a selection of concepts in a simplified form that are further described in the Detailed Description below. This summary is not intended to identify key features or essential features of the claimed subject matter, nor is it intended to be used as an aid in determining the scope of the claimed subject matter.

According to some embodiments, the present disclosure is directed to a method for processing audio. The method may include receiving, via a digital filter module, at least one acoustic signal; receiving, in real-time, one or more control input signals indicative of one or more corresponding interpolator values; determining, based on the one or more interpolator values, one or more interpolated encoded values by interpolating encoded values of a plurality of frequency responses; determining one or more filter coefficients based on decoding the interpolated encoded values; generating, in real-time, a filter from the one or more determined filter coefficients; applying the generated filter to the at least one received acoustic signal; and transmitting the at least one filtered acoustic signal.

The present disclosure is also directed to multi-channel morphing digital audio filter modules. In various embodiments, a digital filter module may include one or more control inputs; a processor; and a memory for storing executable instructions, the processor executing the instructions to: receive, via a digital filter module, at least one acoustic signal; receive, in real-time via the one or more control inputs, one or more control input signals indicative of one or more corresponding interpolator values; determine, based on the one or more interpolator values, one or more interpolated encoded values by interpolating encoded values of a plurality of frequency responses, a frequency and a resonance of each frequency response being encoded independently; determine one or more filter coefficients based on decoding the interpolated encoded values; generate a filter from the one or more determined filter coefficients; apply the generated filter to the at least one received acoustic signal; and transmit the at least one filtered acoustic signal.

According to one or more exemplary embodiments, methods may include receiving, via a digital filter module, at least one acoustic signal; receiving, in real-time, first, second, and third control input signals indicative of first, second, and third interpolator values; determining one or more filter coefficients, the determining comprising, for each corresponding filter section of the plurality of fixed frequency responses: (i) linearly interpolating, based on the first, second, and third interpolator values and encoded values from a plurality of encoded filter parameter tables, encoded values indicative of a pole and a zero of each of the plurality of fixed frequency responses; (ii) decoding the interpolated encoded values; and (iii) calculating a section output based on the decoded values, the determining one or more filter coefficients further including linearly interpolating, based on the first, second, and third interpolator values and the encoded values from a plurality of encoded filter parameter tables, and decoding an encoded value of a filter gain. The method may further include generating, in real-time, a filter from the one or more determined filter coefficients, the filter being unconditionally stable; applying the generated filter to the at least one received acoustic signal; and transmitting the at least one filtered acoustic signal.

Additional objects, advantages, and novel features of the examples will be set forth in part in the description which follows, and in part will become apparent to those skilled in the art upon examination of the following description and the accompanying drawings or may be learned by production or operation of the examples. The objects and advantages of the concepts may be realized and attained by means of the methodologies, instrumentalities and combinations particularly pointed out in the appended claims.

BRIEF DESCRIPTION OF THE DRAWINGS

Embodiments are illustrated by way of example, and not by limitation in the figures of the accompanying drawings, in which like references indicate similar elements.

DETAILED DESCRIPTION

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is therefore not to be taken in a limiting sense, and the scope is defined by the appended claims and their equivalents.

In general, various embodiments of the present disclosure are directed to a multi-channel morphing digital audio filter module that applies a complex, $14^{th}$ order, filter having a frequency response that varies in real-time. The real-time frequency response of the filter may be determined by interpolating among as many as eight different fixed frequency responses. Visually, the eight different fixed frequency responses may be represented as the eight vertices of a cube, as will be shown and described in FIG. 5. A set of eight fixed frequency responses will be referred to herein as a cube. Three control parameters determine a location within the cube along an x, y, and z axis respectively. Throughout the present disclosure, the x, y, and z axes may be referred to as frequency, morph, and transform. Based on a value of the three control parameters and the eight fixed frequency responses, the real-time frequency response is determined by interpolating between encoded coefficients of each fixed frequency response.

Figure 1A:
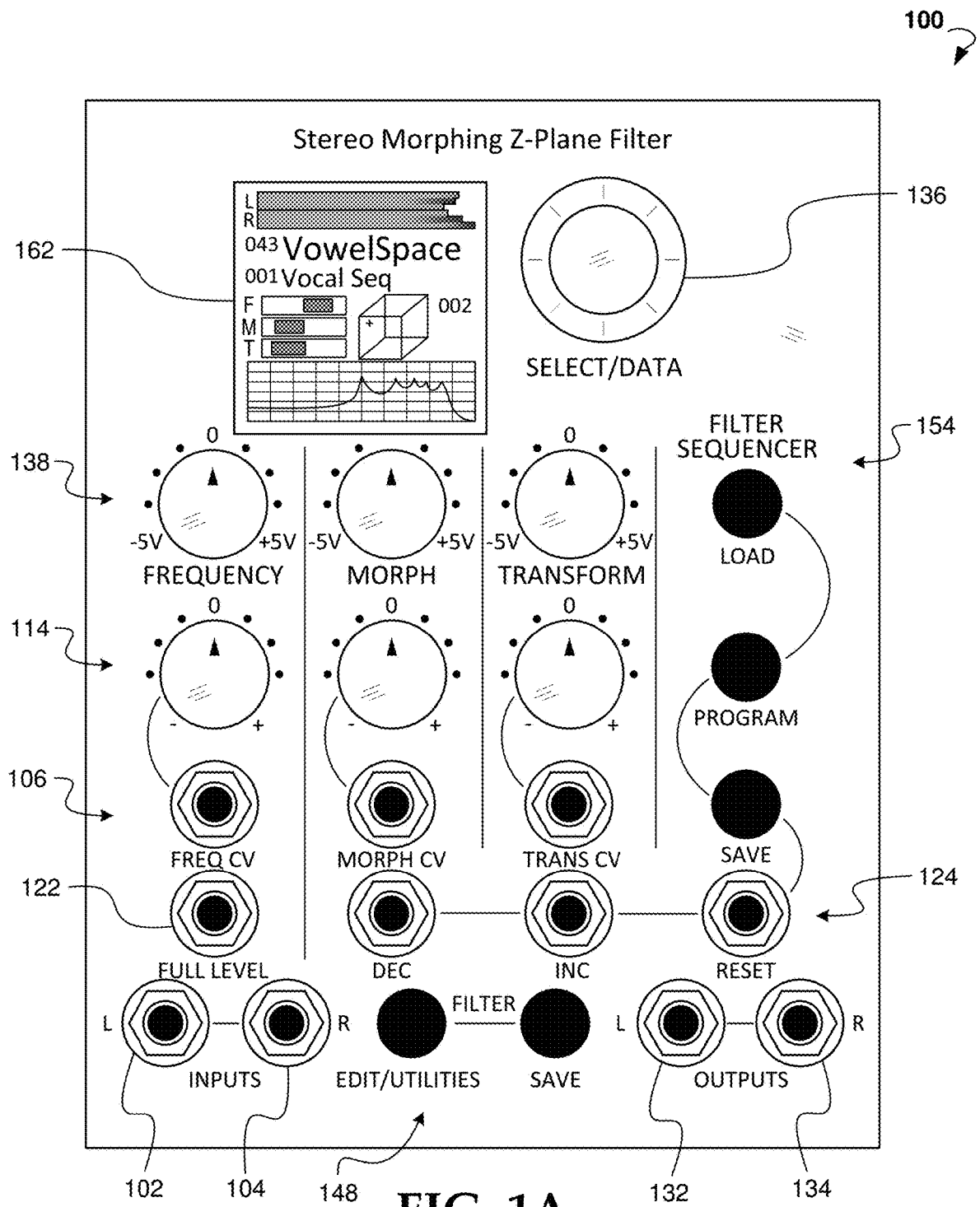
FIG. 1A is an exemplary multi-channel morphing digital audio filter module, according to embodiments of the present disclosure.
Figure 1B:
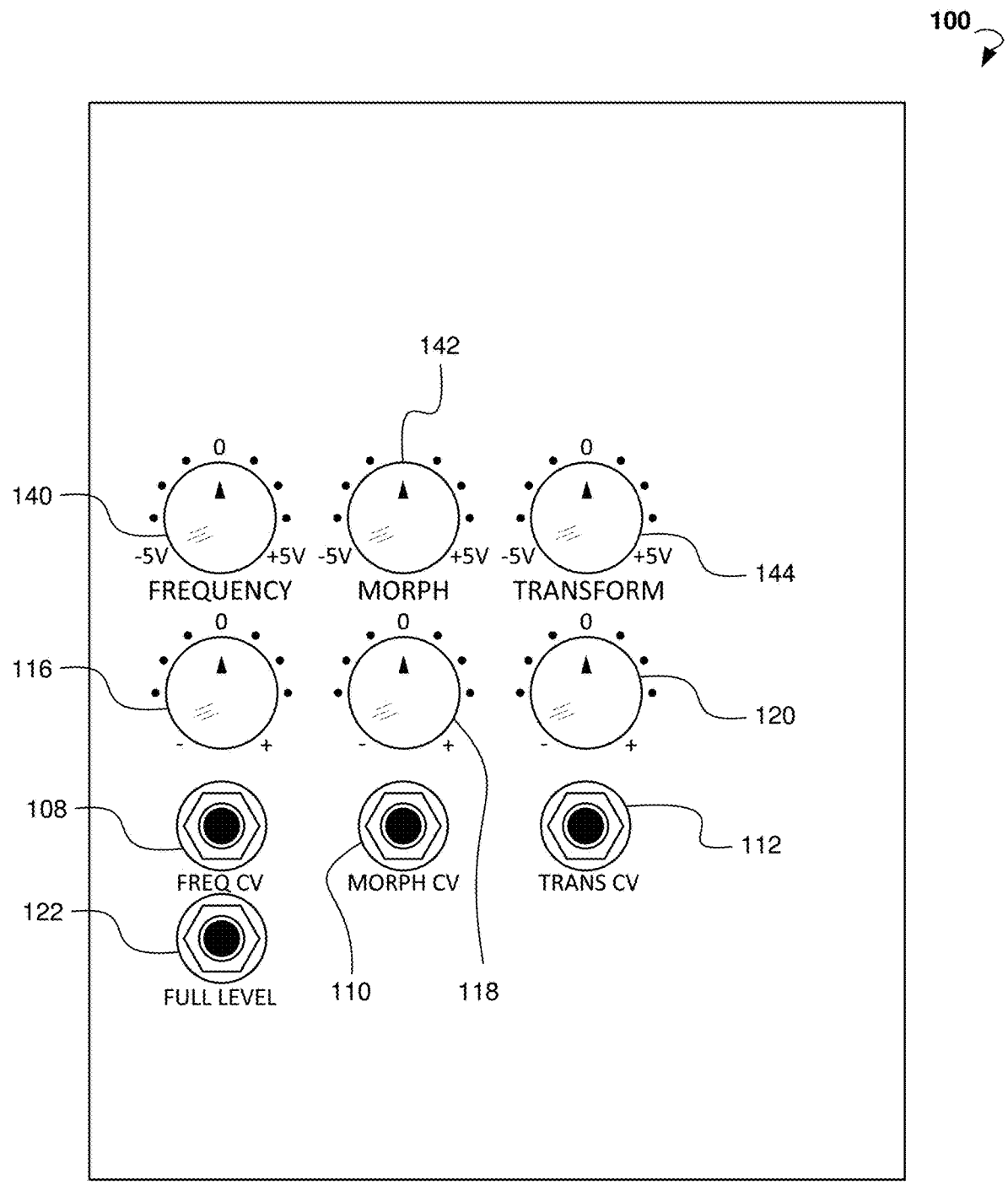
FIG. 1B illustrates a portion of the multi-channel morphing digital audio filter module of FIG. 1A, according to embodiments of the present disclosure.
Figure 1C:
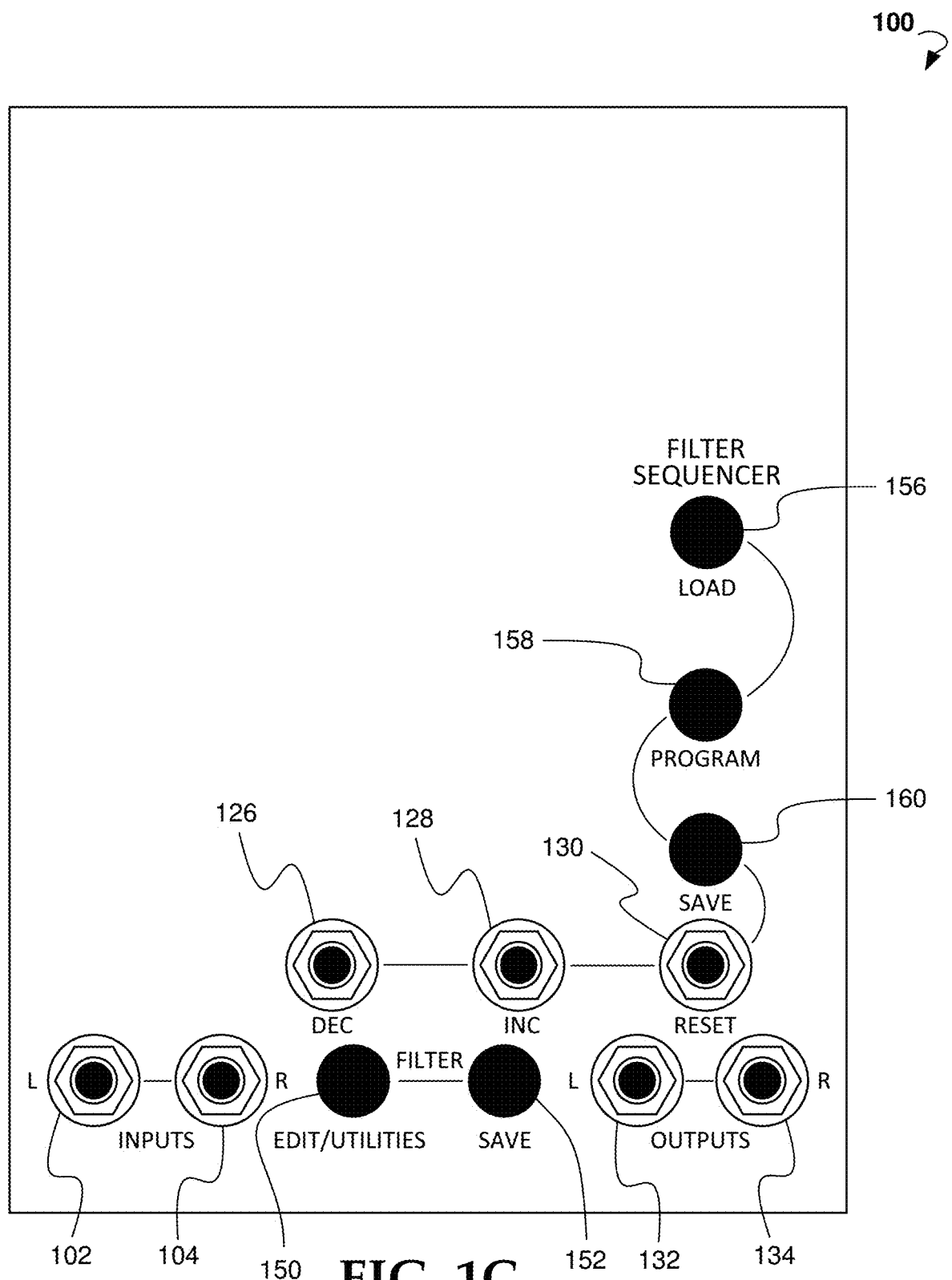
FIG. 1C depicts another portion of the multi-channel morphing digital audio filter module of FIG. 1A, according to embodiments of the present disclosure.
Figure 1D:
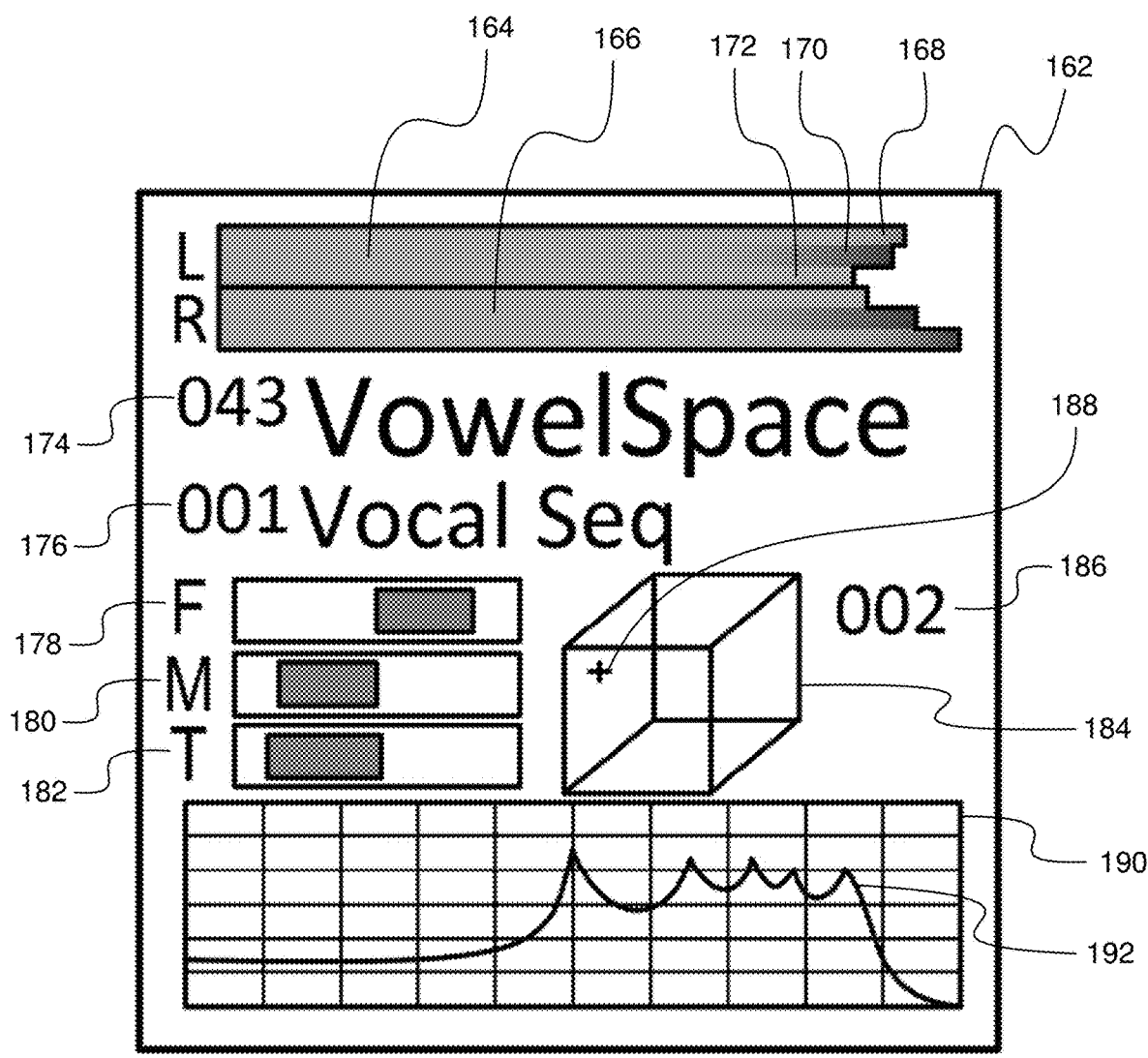
FIG. 1D shows a detailed view of the graphical user interface of the multi-channel morphing digital audio filter of FIG. 1A, according to embodiments of the present disclosure.

FIGS. 1A-1D illustrate an exemplary digital filter module 100, otherwise referred to as a multi-channel morphing digital audio filter, according to the present disclosure. The digital filter module 100 facilitates smoothly interpolating between up to eight frequency responses in real-time. Each combination of up to eight frequency responses may be referred to as a cube (or filter cube or filter cube configuration), in which each cube has up to eight fixed, complex frequency responses. In various embodiments, the digital filter module 100 applies a dynamic, complex, $14^{th}$ order digital audio filter to an input stereo audio signal, the filter varying in real-time based on simultaneous control of three input parameters. FIG. 1A depicts the entire digital filter module 100, while FIGS. 1B-1D show portions of the digital filter module 100 for purposes of discussion.

Figure 2:
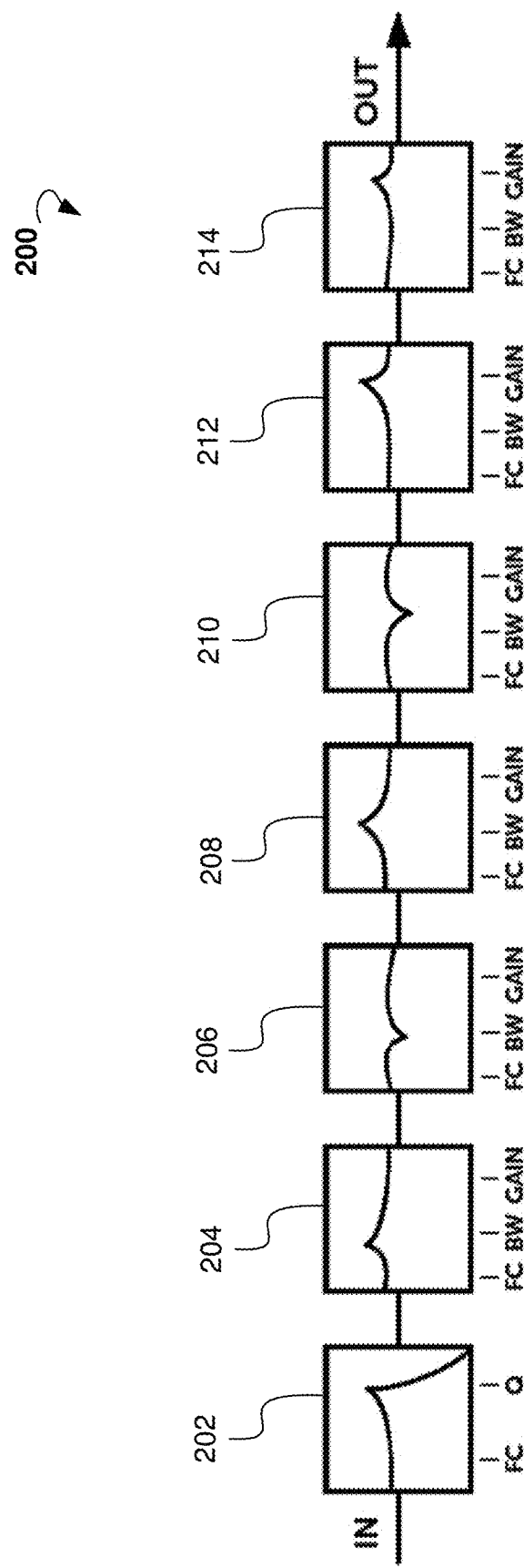
FIG. 2 is a diagrammatic representation of a frequency response, according to embodiments of the present disclosure.

Briefly referring to FIGS. 2-5, the digital filter module may interpolate an applied frequency response based on a location within the cube and the eight frequency responses which compose the cube. FIG. 2 illustrates an exemplary frequency response 200 as a static configuration of a $14^{th}$ order filter. For example, as depicted, the aggregate frequency response 200 may be configured as six independent bands of parametric equalizer sections (filter sections 204 through filter section 214), and a low-pass section 202. Other combinations of poles and zeros, and the order in which they are implemented, can be varied and still be within the scope of the present disclosure.

Figure 3:
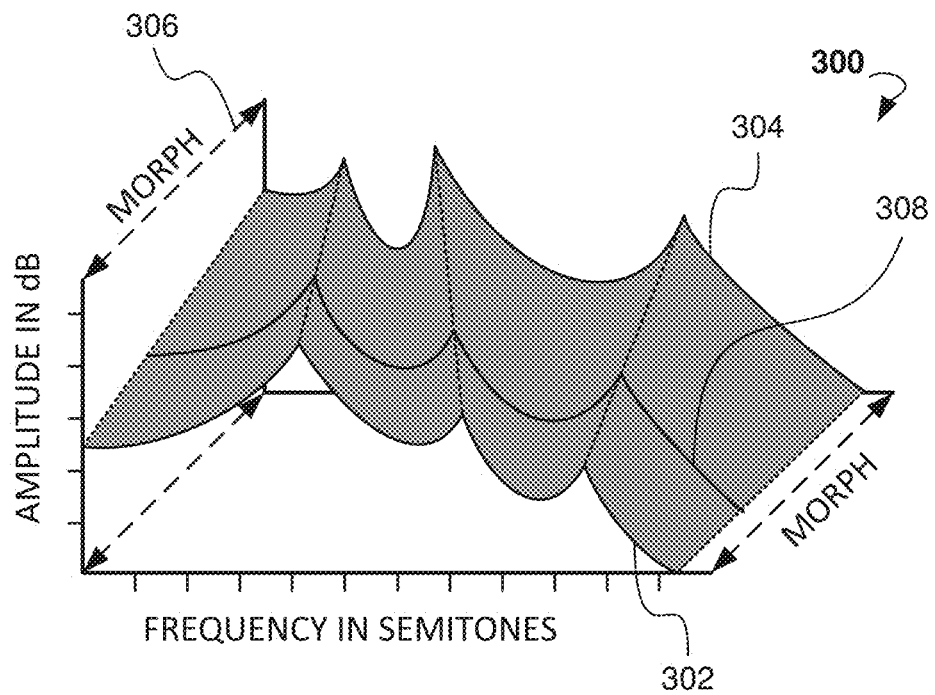
FIG. 3 is a visual representation of morphing between a first and a second frequency response using a first interpolation parameter, according to embodiments of the present disclosure.

FIG. 3 depicts a graphical representation 300 of how morphing is performed between a first filter 302 and a second filter 304. Most known digital filter topologies use coefficients whose values are related directly to the coordinates (the sine or cosine of the angle and the radius or its square) of the poles and zeros of the filter. Human perception of audio, in contrast, comprehends pitch as a logarithmic function of frequency (which is proportional to pole angle and zero angle), for example, as the octaves and semitones of a keyboard, and loudness or resonance as the logarithmic function decibels. Consequently, attempts to evenly change the coefficients of a digital filter from one frequency response to another do not result in the perceived sound of the filter evenly changing according to human perception.

Rather than evenly interpolate the digital filter coefficients per se, those coefficients are encoded into a perceptual space so that interpolation within the encoded space results in perceptually even changes when the linearly interpolated encoded coefficients are decoded and applied to the digital filter. In general, it can be said that a desirable encoded space completely separates the frequency (angle) and resonance (radius) of the poles and zeros, and that the encoded space closely approximates a logarithmic encoding of the angle over the musical span (approximately 20 Hz to 10 kHz), and closely approximates the logarithm of the resonant peak or notch (which for highly resonant poles is approximately the reciprocal of unity minus the radius of the pole and for highly attenuating zeros is approximately unity minus the radius of the zero). As such, the present disclosure provides several improvements to morphing between a plurality of filters, as will be shown.

In FIG. 3, a first filter 302 and a second filter 304 are interpolated along a first axis 306, otherwise referred to as the morph axis, to generate a morphed filter 308, by linearly interpolating digital filter coefficients in an encoded space and subsequently decoding the linear interpolated encoded values. As shown in FIG. 3 each filter 302, 304 may comprise many different frequency, bandwidth, resonance, and gain parameters. By morphing between the first filter 302 and the second filter 304 along the first axis 306, each parameter of the resulting filter is varied simultaneously in real-time in a perceptually even manner via a single CV-controllable parameter.

Figure 4:
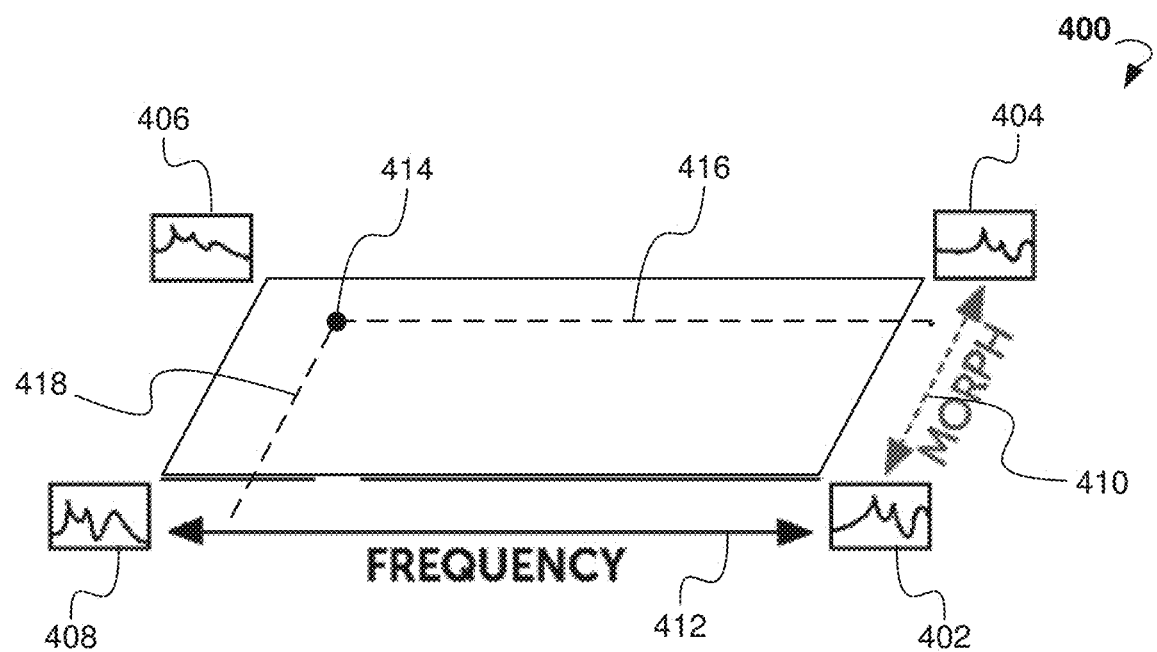
FIG. 4 is a visual representation of morphing between four frequency responses using a first and a second parameter, according to embodiments of the present disclosure.

FIG. 4 illustrates a graphical representation 400 of a bilinear morphing between a first filter 402, a second filter 404, a third filter 406, and a fourth filter 408, along a first axis 410 and a second axis 412, based on a location 414. The first axis 410 may also be referred to as the morph axis, and the second axis 412 as the frequency axis. The location 414 may comprise a first interpolator parameter 418, in this case referred to as a morph interpolator parameter, and a second interpolator parameter 416, referred to here as a frequency interpolator parameter. The bilinear morphing may be performed as a first morphing and a second morphing, both in encoded coefficient space. The first morphing includes generating two intermediary encoded filter coefficient sets, a first intermediary encoded filter coefficient sets from morphing between the first filter 402 and the second filter 404 based on the first interpolator parameter 418, and a second intermediary encoded filter coefficient sets from morphing between the third filter 406 and the fourth filter 408 based on the first interpolator parameter 418. The second linear interpolation then includes morphing between the two intermediary encoded filter coefficient sets based on the second interpolation parameter 416.

Figure 5:
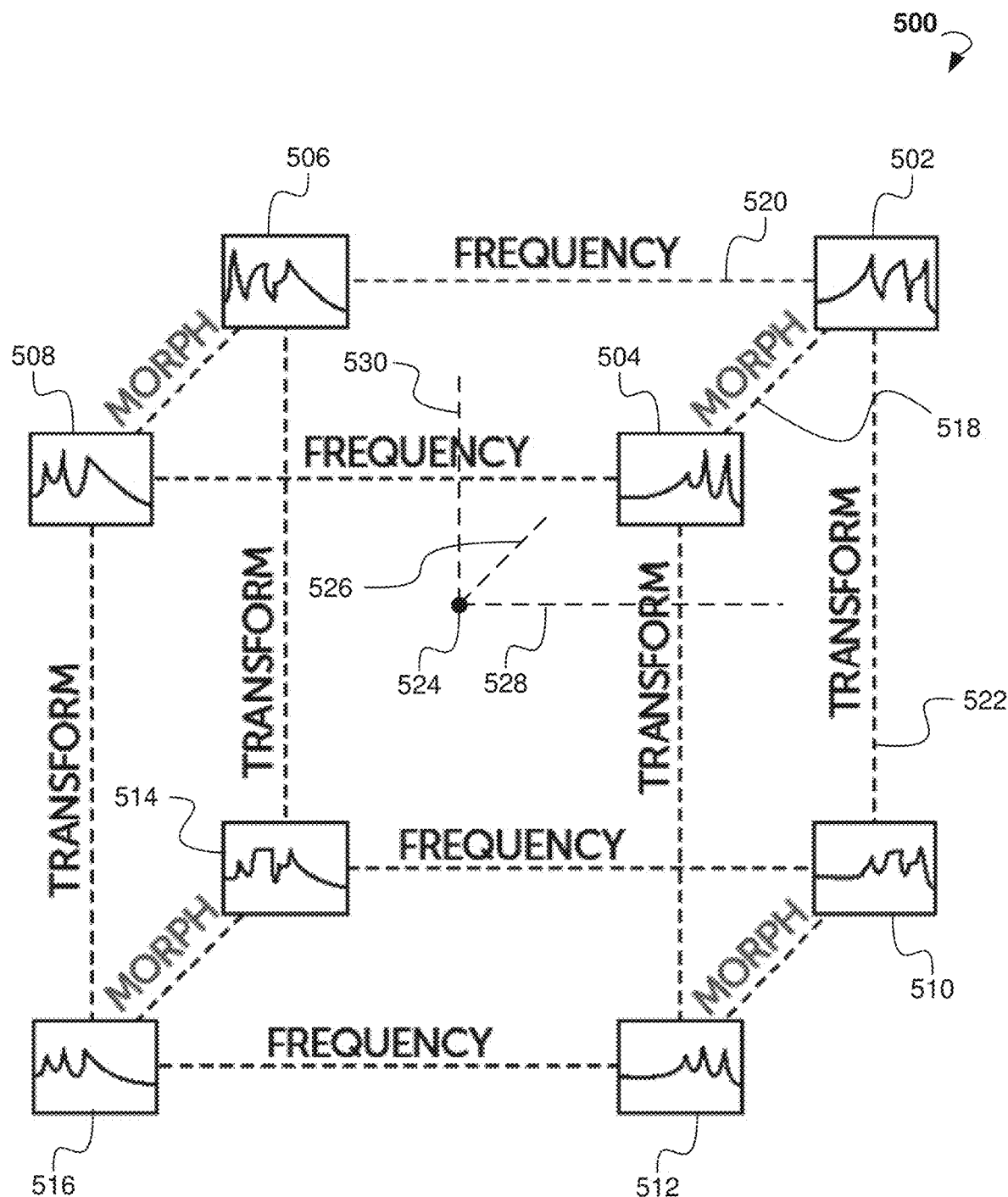
FIG. 5 is a visual representation of morphing between eight frequency responses using a first, a second, and a third parameter, according to embodiments of the present disclosure.

FIG. 5 illustrates a graphical representation 500 of a filter cube having eight frequency responses 502, 504, 506, 508, 510, 512, 514, and 516, and three axes including a first axis 518 (e.g. morph axis), a second axis 520 (e.g. frequency axis), and a third axis 522 (e.g. transform axis). A spatial coordinate 524 associated with a particular location within the filter cube indicates three interpolator parameters, including a first interpolator parameter 526 along the first axis 518, a second interpolator parameter 528 along the second axis 520, and a third interpolator parameter 530 along the third axis 522. A trilinear morphing may be performed along all three axes in real-time, as will be described in greater detail herein. It is to be understood that the term morphing may refer to a single morphing (e.g. FIG. 3), a bilinear morphing (e.g. FIG. 4), and a trilinear morphing (e.g. FIG. 5). Methods of the present disclosure may include morphing in real-time over any number of dimensions.

Referring back to FIG. 1A, in various embodiments the digital filter module 100 includes left and right input channels 102, 104, control voltage (CV) inputs 106, axis attenuverters 114, a full level CV input 122, filter sequencer inputs 124, left and right output channels 132, 134, a data encoder dial 136, axis control knobs 138, filter buttons 148, sequencer buttons 154, and a graphical user interface 162.

The left and right input channels 102, 104 facilitate receiving a first and a second (or a left and a right) acoustic signal, collectively referred to as a stereo audio signal. In various embodiments, a first and a second channel associated with the left and the right input channels 102, 104 are separated throughout processing by the digital filter module 100. While left and right input channels 102, 104 may receive acoustic signals, the left and right input channels 102, 104 may similarly receive and be used to process CVs.

Furthermore, the left and right output channels 132, 134 are configured to transmit a first and a second output acoustic signal, respectively.

In various embodiments, while the first and second channels may be completely independent, each channel may be processed by the same filter. Individual gain and distortion parameters may be selected for each channel specifically. Thus, while the first and the second acoustic signal may correspond to a stereo audio signal, the first and the second acoustic signal may be unrelated or independent. Similarly, each channel of a multi-channel signal may be processed by an independently morphed filter with its own interpolator parameters.

The axis attenuverters 114 facilitate modification of the CV input signals received at their associated CV inputs 106. In response to an axis attenuverter set to a zero position, no CV at the associated CV input is passed to the associated axis. In response to the axis attenuverter set to a positive value (e.g. rotating the axis attenuverter clockwise), an amplitude of the CV increases until, at maximum clockwise rotation, the full amplitude of the CV input signal at the associated CV input is passed through. In response to the axis attenuverter set to a negative value (e.g. rotation the axis attenuverter counter-clockwise), the received CV input signal is inverted (e.g. a CV of +2.5 becomes −2.5V). The farther counter-clockwise the axis attenuverter is rotated, the less attenuation of the inverted signal, until, at maximum counter-clockwise rotation, the full amplitude of the inverse of the CV input signal is passed through.

The data encoder dial 136 is used to select and load filters and sequences, as well as set the value of various parameters. The data encoder dial 136 may additionally be a push button used to load the currently selected filter or sequence, or to enter a currently selected parameter value.

The axis control knobs 138 facilitate the user manually setting a control voltage for an associated axis. It is to be understood, however, that the control voltage for each axis may alternatively or additionally be automatically varied. Adjustment of each axis control knob is indicated in real-time via the graphical user interface 162 by both graphical CV indicators 178, 180, 182 and by the position of the interpolation point 188 in the 3D cube graphic 184, as will be described in further detail in FIG. 1D.

As shown in FIG. 1B, the CV inputs 106 may include a frequency CV input 108, a morph CV input 110, and a transform CV input 112, and the axis attenuverters 114 may include a frequency attenuverter 116, a morph attenuverter 118, and a transform attenuverter 120. In some embodiments, the axis control knobs 138 include a frequency knob 140, a morph knob 142, and a transform knob 144. The frequency CV input 108 is configured to receive a CV input signal that is modified by the associated frequency attenuverter 116 and summed with the value of the frequency knob 140 and an unattenuated CV input received at the full level CV input 122 to produce a final frequency control value. The final frequency control value may be used as an interpolator parameter for the real-time interpolation of frequency responses.

The morph CV input 110 may be configured to receive a CV input signal that is modified by the associated morph attenuverter 118 and summed with the value of the morph knob 142 to produce a final morph control value. The final morph control value may similarly be used as an interpolator parameter for the real-time interpolation of frequency responses. Likewise, the transform CV input 112 may be configured to receive a CV input signal that is modified by the associated transform attenuverter 120 and summed with the value of the transform knob 144 to produce a final transform control value, or optionally, a final distortion control value. The final transform control value may similarly be used as an interpolator parameter for the real-time interpolation of frequency responses.

A stored setting in the digital filter module 100 may determine whether transform controls distortion. If the stored setting is indicative that transform controls distortion, the transform interpolator parameter is set to a static value, and the final transform control value determines the distortion threshold, and thus the amount of distortion produced by the applied filter. In other embodiments, the distortion threshold may be controlled by an additional distinct control parameter, or the transform interpolator parameter and the distortion threshold can be independent CVs.

Referring to FIG. 1C, in various embodiments the digital filter module 100 includes a filter sequencer. The filter sequencer facilitates the creation of an ordered list of filters and stepping through the ordered list of filters under trigger control or manual control via the sequencer buttons 154, including a load button 156, a program button 158, and a save button 160, and the data encoder dial 136. A filter sequence may include a list of steps containing one or more filters, such as predetermined filter cubes. One or more commands may be part of the filter sequencer to affect the progress of the sequence or the timing of the filter fading in and/or out.

In some embodiments, progress of the filter sequencer is controlled by the filter sequencer inputs 124. The filter sequencer inputs 124 may comprise a decrement input 126, an increment input 128, and a reset input 130. In response to loading a new sequence, the filter sequencer begins at a first step. Steps may include filters, a navigation command such as pause, halt, or bumper, and a fade time scale command. Subsequently, any reset rising edge received at the reset input 130 acts to jump to the first step and load an associated filter or command. Any decrement or increment rising edge received at the decrement input 126 or increment input 128, respectively, will cause the sequence to move to the previous or next step, respectively. If the step is a filter, the filter will be immediately loaded, otherwise if the step is a command it will take effect. The sequence may move circularly. That is, once the filter sequencer reaches the last sequence, it may increment forward to the first step.

Filter buttons 148 may include an edit/utilities button 150 and a save button 152. The digital filter module 100 may facilitate the creation of custom filters by setting one or more parameters associated with the custom filter. The one or more parameters may include a predefined filter cube, a frequency CV offset, a morph CV offset, a transform CV offset, a frequency CV gain, a morph CV gain, a transform CV gain, an enter fade time, an exit fade time, a left and a right gain, a left and a right distortion, and an indication of whether transform controls distortion. The filter buttons 148, in conjunction with the data encoder dial 136, facilitate the creation of custom filters.

FIG. 1D depicts a detailed view of the graphical user interface 162. In various embodiments, the graphical user interface 162 includes left and right volume unit bars 164, 166, a currently loaded filter indicator 174, a currently loaded sequence indicator 176, interpolator input indicators 178, 180, 182, a cube graphic 184, and a real-time plot 190 indicative of a current frequency response 192 of the applied filter.

Left and right volume unit bars 164, 166 indicate a left and right input channel level, respectively. Each of the left and right volume unit bars 164, 166 comprise a top horizontal bar, a middle horizontal bar, and a bottom horizontal bar, which will be described in relation to each bar of the left volume unit bar 164. The left volume unit bar 164 includes a top horizontal bar 168 indicative of the left channel's input level. A length and color of the top horizontal bar 168 reflects the input level. For example, as the level increases towards the right, the color of the bar may transition from green, to yellow, to red, depending on how close to clipping the left acoustic signal is. A middle horizontal bar 170 of the left volume unit bar 164 indicates the amount of distortion that results from the distortion settings of the digital filter module 100. A color of the middle horizontal bar 170 (e.g. red) may indicate distortion. In certain embodiments, a bottom horizontal bar 172 of the left volume unit bar 164 indicates an output level associated with the left output channel. Likewise, a length and color of the bottom horizontal bar 172 may be indicative of clipping of the output acoustic signal. It is to be understood that a top horizontal bar, a middle horizontal bar, and a bottom horizontal bar of the right volume unit bar 166 may operate in a similar fashion, relating to the right channel's input level, distortion, and right output channel, respectively.

The currently loaded filter indicator 174 may include an identifier number and an identifier name of the currently loaded filter. Likewise, the currently loaded sequence indicator 176 may include an identifier number and an identifier name of the currently loaded sequence.

The interpolator input indicators 178, 180, 182 depict the real-time values of the frequency (F), morph (M), and transform (T)/distortion (D) inputs to the digital filter module. The transform interpolator input indicator 182 may instead indicate the distortion if the transform controls distortion setting is active. It is to be understood that the displayed real-time value is the summed, final value of the respective interpolator parameter, without scaling, as previously described. The cube graphic 184 shows the resulting position of the interpolation point 188 after all scaling.

The cube graphic 184 illustrates three dimensional parameter space of the currently selected filter cube. In various embodiments, an interpolation point 188 represented by a cross within the cube indicates the real-time position of the interpolation point 188 as defined by the values of the three individual parameter axes. An identifier 186 may be displayed to illustrate the identifier associated with the currently loaded filter cube.

In certain embodiments, the real-time plot 190 is a real-time animated plot of the current frequency response (indicated by curve at reference number 192) of the filter. For example, the horizontal axis may represent frequency, with lines every octave starting at 20 Hz, and the vertical axis may represent amplitude, with lines every 10 dB from −30 dB to +30 dB.

The graphical user interface 162 may further display a current sequence step number and an indication of a currently active command. In response to receiving a rising edge at any sequence input 124, the display may briefly flash an indicator showing which input was activated. The graphical user interface 162 may similarly include an indicator of the current fade time scale factor, if active.

Figure 6:
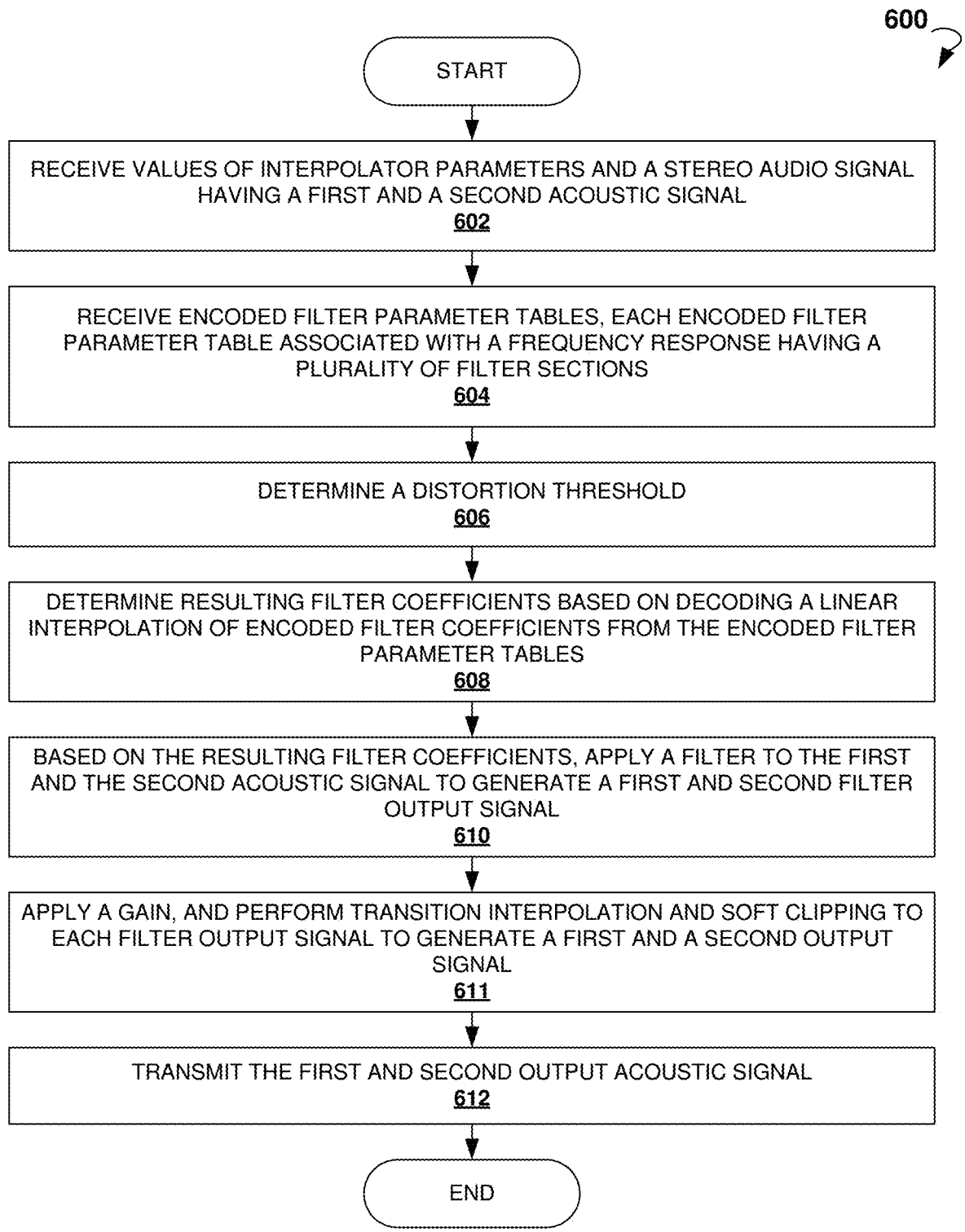
FIG. 6 is a flow chart showing an exemplary method for dynamic complex filtering of an acoustic signal by real-time morphing of frequency responses, according to embodiments of the present disclosure.

FIG. 6 is a flow diagram illustrating a method 600 for applying a multi-channel morphing digital audio filter, including dynamic complex filtering of an acoustic signal by real-time interpolation of frequency responses. In block 602, the example method 600 can commence with receiving values of interpolator parameters and a multi-channel audio signal. The interpolator parameters and the multi-channel audio signal may be received by an analog-to-digital converter (ADC) or other suitable input device. The multi-channel audio signal may include a first and a second acoustic signal (e.g. a left and a right acoustic signal). It is to be understood that, while steps of method 600 may apply to both the first and second acoustic signal, a single acoustic signal may similarly be received and filtered. Furthermore, as the dynamic complex filtering is performed in real-time, the multi-channel audio signal may be a portion of a larger audio input.

While in certain embodiments, the interpolator parameter values are directly applied to the interpolation calculation, alternatively the method 600 may further include filtering the interpolator data values with static or time varying filter coefficients. The static or time varying filter coefficients may be computed based on previous values of the interpolator input or output. For example, such a filter may include a low-pass filter with a cutoff frequency similar to the cutoff frequency of the interpolated filter using finite impulse response (FIR) and/or infinite impulse response (IIR) filters. Such a low-pass filter may facilitate smoothing out abrupt steps in the incoming interpolator data, which can otherwise produce an audible clicking transition in the output audio. In some embodiments, methods may further comprise determining whether steps are present in the incoming interpolator data, and, based on the determination, decreasing a cutoff of the low-pass filter and applying the low-pass filter to the incoming interpolator data.

In block 604, encoded filter parameter tables may be received from memory. Each encoded filter parameter table may be associated with a frequency response. In certain embodiments, the frequency response is fixed and complex, and comprises a plurality of filter sections, each filter section having a pole-zero pair. For example, an exemplary aggregate frequency response may be configured as six independent bands of parametric equalizer sections and a low-pass section, as depicted in FIG. 2. The particular encoded filter parameter tables received may depend on the currently loaded filter cube configuration, each filter cube configuration having up to eight frequency responses associated with a vertex of the filter cube (having an x, y, and z coordinate). Each frequency response has an associated encoded filter parameter table.

In various embodiments, the encoded filter parameter table includes encoded values of filter coefficients for each filter section of the plurality of filter sections of the associated frequency response. The filter coefficients may include a pole radius, a pole angle, a zero radius, a zero angle, and a gain, which together specify the filter. As will be shown, the encoding of the filter coefficients may be a logarithmic space. It is to be understood that, in the present embodiment, the angle (e.g. frequency) and the radius (e.g. amplitude) parameters are completely separated. Advantageously, users can change the expression of the resulting sound by altering harmonic content of the sound signal with the digital filters.

In block 606, a distortion threshold may be determined. In various embodiments, the method 600 includes determining whether a transform interpolator parameter of the interpolator parameter controls distortion. Based on the determination that the transform interpolator parameter controls distortion, a value of the transform interpolator parameter is applied as the distortion threshold and a fixed value is used for the transform interpolator parameter for the remainder of the method. Based on the determination that the transform interpolator parameter does not control distortion, a fixed value is applied as the distortion threshold.

In block 608, determine resulting filter coefficients based on decoding the result of the linear interpolation of encoded filter coefficients from the encoded filter parameter tables. Determining the resulting filter coefficients includes linearly interpolating an encoded value of each filter coefficient stored for each filter section of the plurality of sections, and decoding the interpolated encoded value. The filter coefficients are determined for each of the first and the second acoustic signal. Determining the resulting filter coefficients will be described in greater detail with reference to FIGS. 7A-7B.

In some embodiments, the filter coefficients from the encoded filter parameter tables are encoded in logarithmic space. A decoding operation may include exponentiation, which decodes the encoded value from logarithmic space to linear space (e.g. a Hertz based frequency space). Thus, the linear interpolation is performed on the encoded values in logarithmic space. Alternatively, it would be appreciated that the encoded coefficient space may be described as "linear," in which case the decoded values are in exponential frequencies. However, for the purposes of the present disclosure, the encoded coefficient space will be described as logarithmic space.

In block 610, a filter having the resulting filter coefficients is applied to the first and the second acoustic signal to generate first and second filter output signals. Applying the filter having the filter coefficients may include generating a filter based on the determined filter coefficients from block 608, and in general is described in greater detail with reference to FIG. 7C. In block 611, an encoded gain and an aggregate gain are applied to the first and second filter output signals, any required filter cube transition processing is performed, and soft clipping is applied, to generate a first and second output acoustic signal. In block 612, the first and second output acoustic signals are transmitted to a channel output digital-to-analogue converter (DAC) or other suitable signal output. It is to be understood that each step in the method 600 may be performed in real-time. The method 600 may also be implemented on a single acoustic signal, or a plurality of acoustic signals.

Figure 7A:
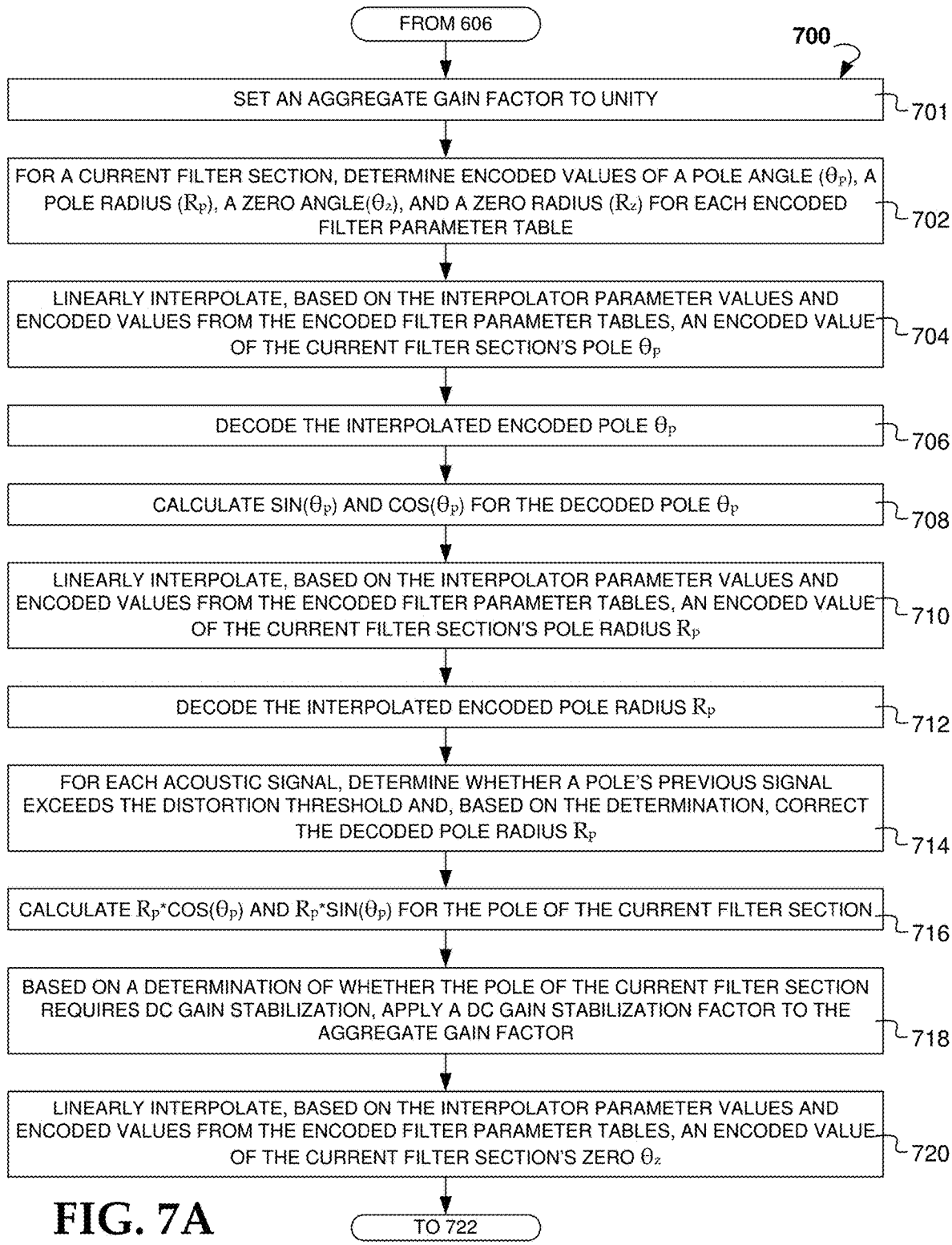
FIGS. 7A-7C illustrate a flow chart showing an exemplary method for determining filter coefficients based on linear interpolation of filter coefficients from the encoded filter parameter table, and for applying a filter based on these filter coefficients to each acoustic signal to produce filter outputs, according to embodiments of the present disclosure.
Figure 7B:
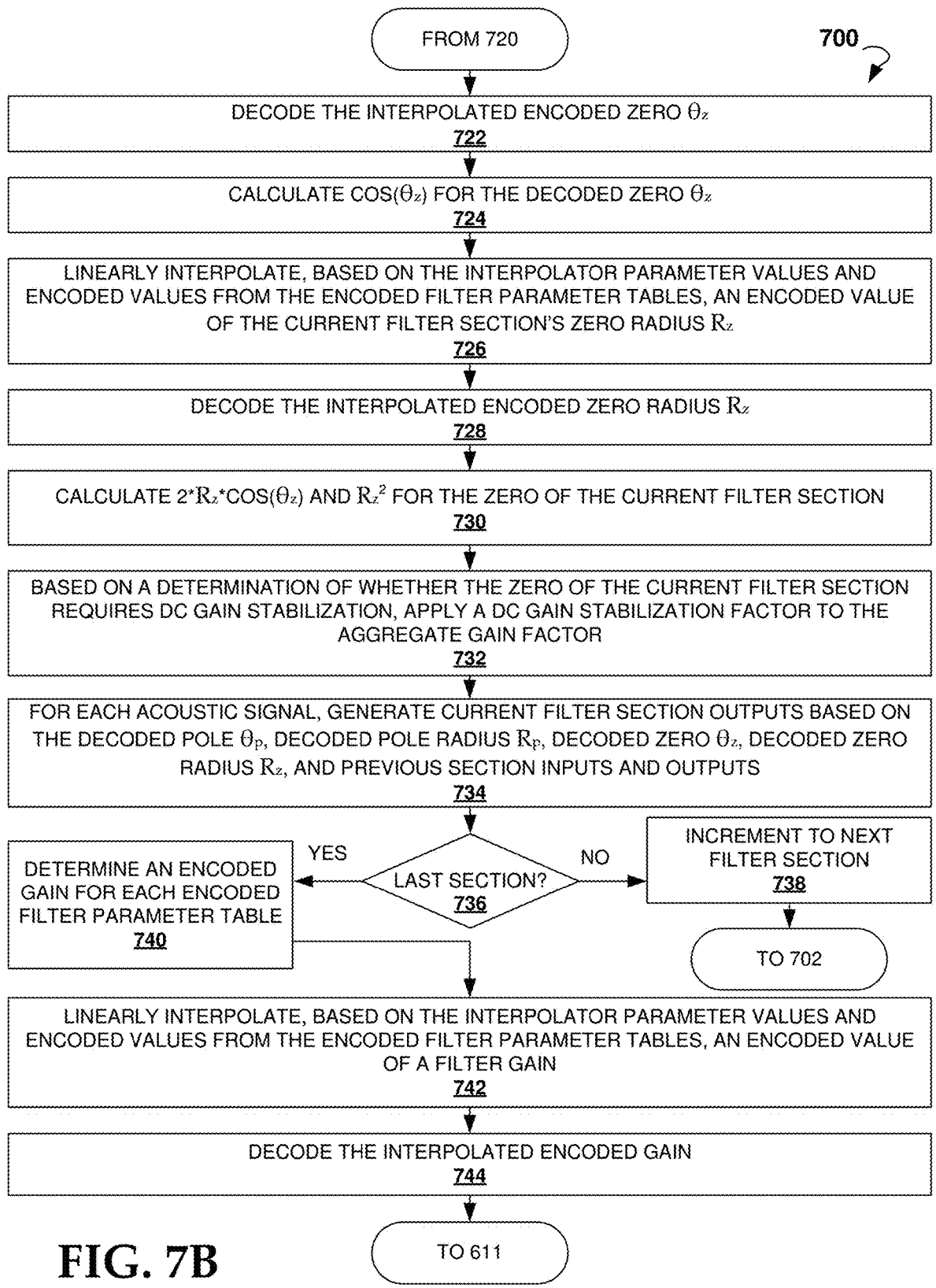
Figure 7C:
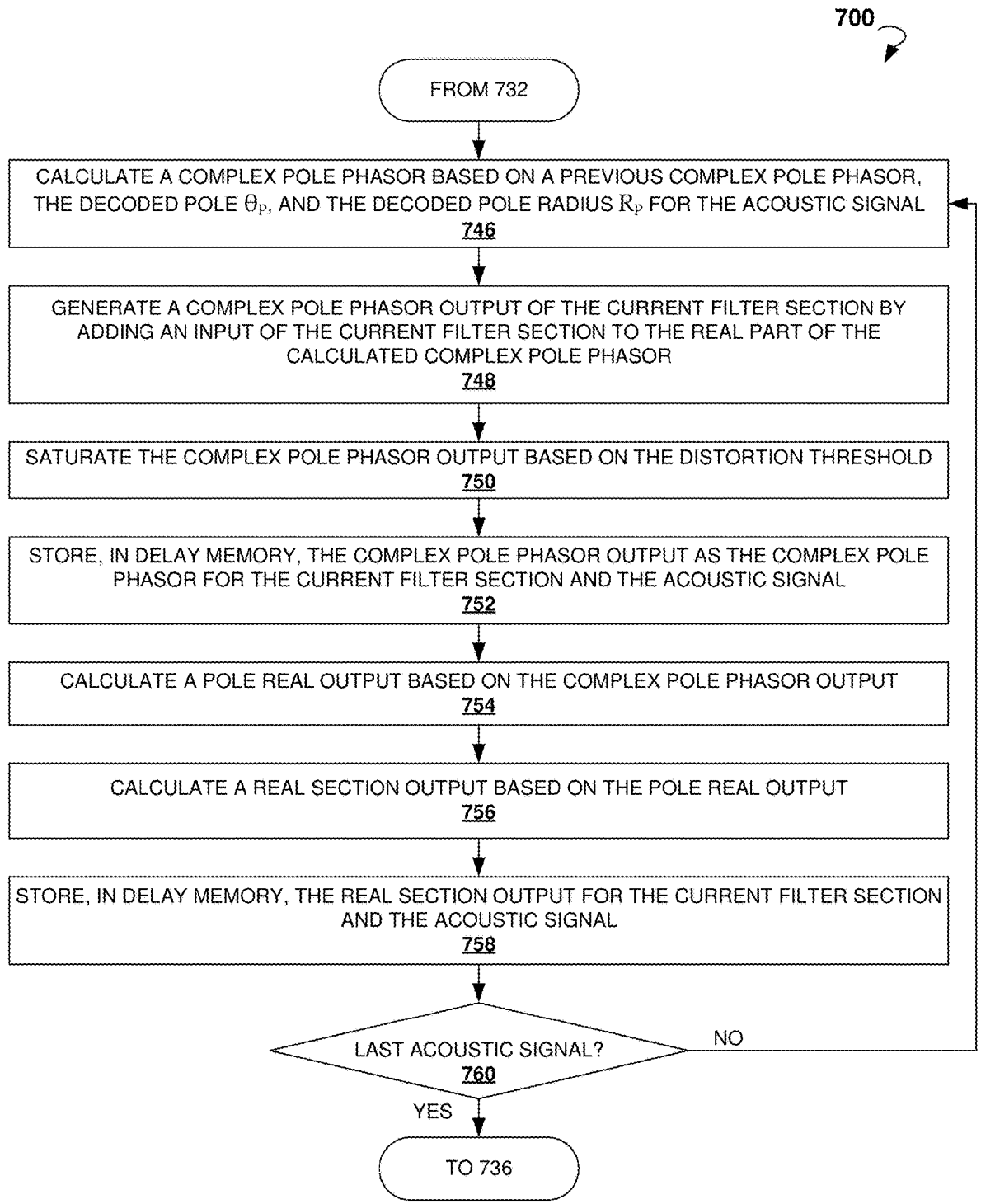

FIGS. 7A-7C illustrate a flow chart showing an exemplary method 700 for determining filter coefficients based on decoding a linear interpolation of encoded filter coefficients from the encoded filter parameter table, and based on the resulting filter coefficients, applying a filter to the first and second acoustic signal to generate a first and second filter output signal as shown in blocks 608 and 610 of FIG. 6. In various embodiments, blocks 702 through block 734 of method 700 are repeated for each filter section of the frequency response, wherein current filter coefficients are generated from the current filter section and the previous filter outputs generated from the previous iteration of the current filter section. The method 700 may commence in block 702 with, for a current filter section, determining encoded values of a pole angle ($\theta_p$), a pole radius ($R_p$), a zero angle ($\theta_z$), and a zero radius ($R_z$) for each encoded filter parameter table. For example, each encoded filter parameter table may comprise encoded values for the pole $\theta_p$, pole radius $R_p$, zero $\theta_z$, and a zero radius $R_z$ for each filter section in the associated frequency response. The encoded filter parameter table may further comprise an encoded value for a filter gain of the frequency response.

Blocks 704 through block 718 illustrate steps performed based on a pole of the current filter section.

In block 704, an encoded value of the current filter section's pole $\theta_p$ is linearly interpolated based on the interpolator parameter values and the encoded values of the pole $\theta_p$ from the encoded filter parameter tables. The resulting encoded value of pole $\theta_p$ and the encoded values of pole $\theta_p$ from the encoded filter parameter tables, are encoded in the logarithmic space. In block 706, the encoded value of pole $\theta_p$ is decoded via exponentiation from the logarithmic space into a linear space. In block 708, $\sin(\theta_p)$ and $\cos(\theta_p)$ are calculated for the decoded pole $\theta_p$, which will be used in subsequent steps. It is to be understood that any suitable mathematical approximation of the sine, cosine, and exponential functions may be implemented. In particular, as long as the approximations do not permit the pole radii to exceed unity, thus causing the filter to be unstable, minor differences in mathematical approximations may not noticeably affect the resulting sound.

According to the present disclosure, linear interpolation of encoded values may be performed as a bilinear interpolation, trilinear interpolation, or other higher order interpolation of the encoded values, depending on the number of frequency responses in the filter cube configuration. For example, in a filter cube configuration having eight frequency responses, a trilinear interpolation is used. Each encoded value from a corresponding encoded filter parameter table resides at a different vertex of a cube in a cubic lattice. A first interpolation is performed along a first axis, associated with a first interpolator value. Four first interpolated encoded values are generated from interpolating pairs of the encoded values, which reside along axes parallel to the first axis, based on the first interpolator value. The first interpolated encoded values reside at different vertices of a square in two dimensions. A second interpolation is similarly performed based on the second interpolator value along a second axis. A third interpolation is then performed based on the third interpolator value along a third axis, resulting in the final interpolated value. Other suitable methods for interpolation may alternatively or additionally be used.

In block 710, an encoded value of the current filter section's pole radius ($R_p$) is linearly interpolated based on the interpolator parameter values and the encoded values of the pole radius $R_p$ from the encoded filter parameter tables. In various embodiments, while the encoded values are different than block 704, the linear interpolation process is the same. The resulting encoded value of pole radius $R_p$, as well as the encoded values of pole radius $R_p$ from the encoded filter parameter tables, is encoded in the logarithmic 1-R space. In block 712, the encoded value of pole radius $R_p$ is decoded via exponentiation from the logarithmic 1-R space into a linear space.

In block 714, for each acoustic signal, the method 700 includes determining whether a pole's previous real signal amplitude exceeds the distortion threshold. It is to be understood that a previous value refers to the value resulting from the previous iteration of the current filter section. The pole's previous real signal amplitude may represent the real signal generated from the method 700 for the previous iteration of the current filter section. Based on the determination that a pole's previous real signal amplitude exceeds the distortion threshold, the method 700 may include correcting the decoded pole radius $R_p$. In some embodiments, the decoded pole radius $R_p$ is corrected by calculating the threshold exceeded value, calculating a correction to the acoustic signal's pole radius $R_p$ based on the threshold exceeded value, and applying the correction to the acoustic signal's pole radius $R_p$. In block 716, $R_p*\cos(\theta_p)$ and $R_p*\sin(\theta_p)$ are calculated for the pole of the current filter section, and for each acoustic signal, which will be used in subsequent steps.

In block 718, the method 700 may include determining whether the pole of the current filter section has been specified to include DC (zero frequency, thus "direct current") gain stabilization, and based on the determining, applying DC gain stabilization. In some embodiments, applying DC gain stabilization includes calculating a gain factor required for unity gain at DC for each acoustic signal for the pole of the current filter section. Otherwise, if the pole of the current filter section does not require DC gain stabilization, the DC gain is set to one. The gain factor thus calculated is aggregated in an aggregate gain factor that has been initialized to unity before the computation of the first filter section in block 701.

Referring to FIGS. 7A-7B, blocks 720 through block 730 illustrate steps performed based on a zero of the current filter section.

In block 720, an encoded value of the current filter section's zero $\theta_z$ is linearly interpolated based on the interpolator parameter values and the encoded values of the zero $\theta_z$ from the encoded filter parameter tables. The resulting encoded value of zero Oz, as well as the encoded values of zero $\theta_z$ from the encoded filter parameter tables, is encoded in the logarithmic space. In block 722, the encoded value of zero $\theta_z$ is decoded via exponentiation from the logarithmic space into a linear space. In block 724, $\cos(\theta_z)$ is calculated for the decoded zero $\theta_z$, which will be used in subsequent steps.

In block 726, an encoded value of the current filter section's zero radius ($R_z$) is linearly interpolated based on the interpolator parameter values and the encoded values of the zero radius $R_z$ from the encoded filter parameter tables. The resulting encoded value of zero radius $R_z$, as well as the encoded values of zero radius $R_z$ from the encoded filter parameter tables, is encoded in the logarithmic 1-R space. In block 728, the encoded value of zero radius $R_z$ is decoded via exponentiation from the logarithmic 1-R space into a linear space. In block 730, $2*R_z*\cos(\theta_z)$ and $R_z^2$ are calculated for the zero of the current filter section, and for each acoustic signal, which will be used in subsequent steps.

In block 732, the method 700 may include determining whether the zero of the current filter section has been specified to include DC gain stabilization, and based on the determining, applying DC gain stabilization. In some embodiments, applying DC gain stabilization includes calculating a gain factor required for unity gain at DC for each acoustic signal for the zero of the current filter section. Otherwise, if the zero of the current filter section does not require DC gain stabilization, the DC gain is set to one. The gain factor thus calculated is aggregated in an aggregate gain factor In block 734, for each acoustic signal, current filter section outputs are generated based on the decoded pole $\theta_p$, decoded pole radius $R_p$, decoded zero $\theta_z$, decoded zero radius $R_z$, and the previous filter outputs (e.g. an output of the previous iteration of the current filter section which may be retrieved from delay memory). Generating the filter outputs will be described in greater detail with reference to FIG. 7C.

At decision block 736, the method 700 determines whether the current filter section is the last filter section of the frequency response. If the current filter section is not the last filter section, the method 700 proceeds to block 738 to increment to the next filter section. The method 700 then repeats blocks 702 through block 734 for the next filter section. Alternatively, if the current filter section is the last filter section, the method 700 proceeds to block 740.

In block 740, an encoded gain is determined for each encoded filter parameter table. In block 742, an encoded value of a filter gain is linearly interpolated based on the interpolator parameter values and the encoded values of the gain from the encoded filter parameter tables. The resulting encoded value of the filter gain, as well as the encoded values of gains from the encoded filter parameter tables, is encoded in a logarithmic gain space. In block 744, the encoded value of the filter gain is decoded via exponentiation from the logarithmic gain space into a linear gain space.

Referring to FIG. 7C, the filter outputs are generated for each acoustic signal based on the decoded pole $\theta_p$, decoded pole radius $R_p$, decoded zero $\theta_z$, decoded zero radius $R_z$, and the previous filter outputs (e.g. an output of the previous iteration of the current filter section which may be retrieved from delay memory). Blocks 746 through block 758 are repeated for each acoustic signal. In block 746, a complex pole phasor is calculated based on a previous complex pole phasor, the decoded pole $\theta_p$, and the decoded pole radius $R_p$ for the acoustic signal. For example, a description of a phasor filter calculation can be found in Massie, Dana, "Coefficient Interpolation for the Max Mathews Phasor Filter," (AES Convention Papers, 113rd Convention, 2012), the contents of which are herein incorporated by reference. In various embodiments, the complex pole phasor is calculated as a rotation of the previous complex pole phasor by $R_p*\cos(\theta_p)+j*R_p*\sin(\theta_p)$ for the pole of the current filter section. In block 748, a complex pole phasor output of the current filter section is generated by adding an input of the current filter section to the real part of the calculated complex pole phasor. In block 750, the complex pole phasor output is saturated based on the distortion threshold. In block 752, the saturated complex pole phasor output is stored as the complex pole phasor for the current filter section and for the acoustic signal. That is, at later iterations of the method steps, the saturated complex pole phasor output will be used for the previous complex pole phasor. Furthermore, the saturated complex pole phasor output may be stored in delay memory. While some embodiments use filter topologies such as phasor filters of poles and a direct form of implementation for zeros, it is to be understood that other suitable filter topologies may be used. The filter topologies may facilitate stability under conditions of time-varying filter coefficients, and calculation of the filter coefficients from the angle and radius of the poles and zeros of the filters.

In block 754, a pole real output is calculated based on the saturated complex pole phasor output. In various embodiments, the pole real output is calculated as Re(phasor)+cot$(\theta_p)*$Im(phasor). In block 756, a real section output is calculated based on the pole real output. In some embodiments, the real section output is calculated as the pole real output times $(1-2*R_z*\cos(\theta_z)*z^{-1}+R_z^2*z^{-2})$. In block 758, the real section output is stored in delay memory for the current filter section and for the acoustic signal.

At decision block 760, the method 700 determines whether blocks 746 through 758 have been performed for each acoustic signal. That is, whether the acoustic signal is the last acoustic signal. Based on the determination that the acoustic signal is not the last acoustic signal, blocks 746 through block 758 are repeated for next acoustic signal. Alternatively, if the acoustic signal is the last acoustic signal, the method 700 proceeds to block 736, as previous described.

Figure 8:
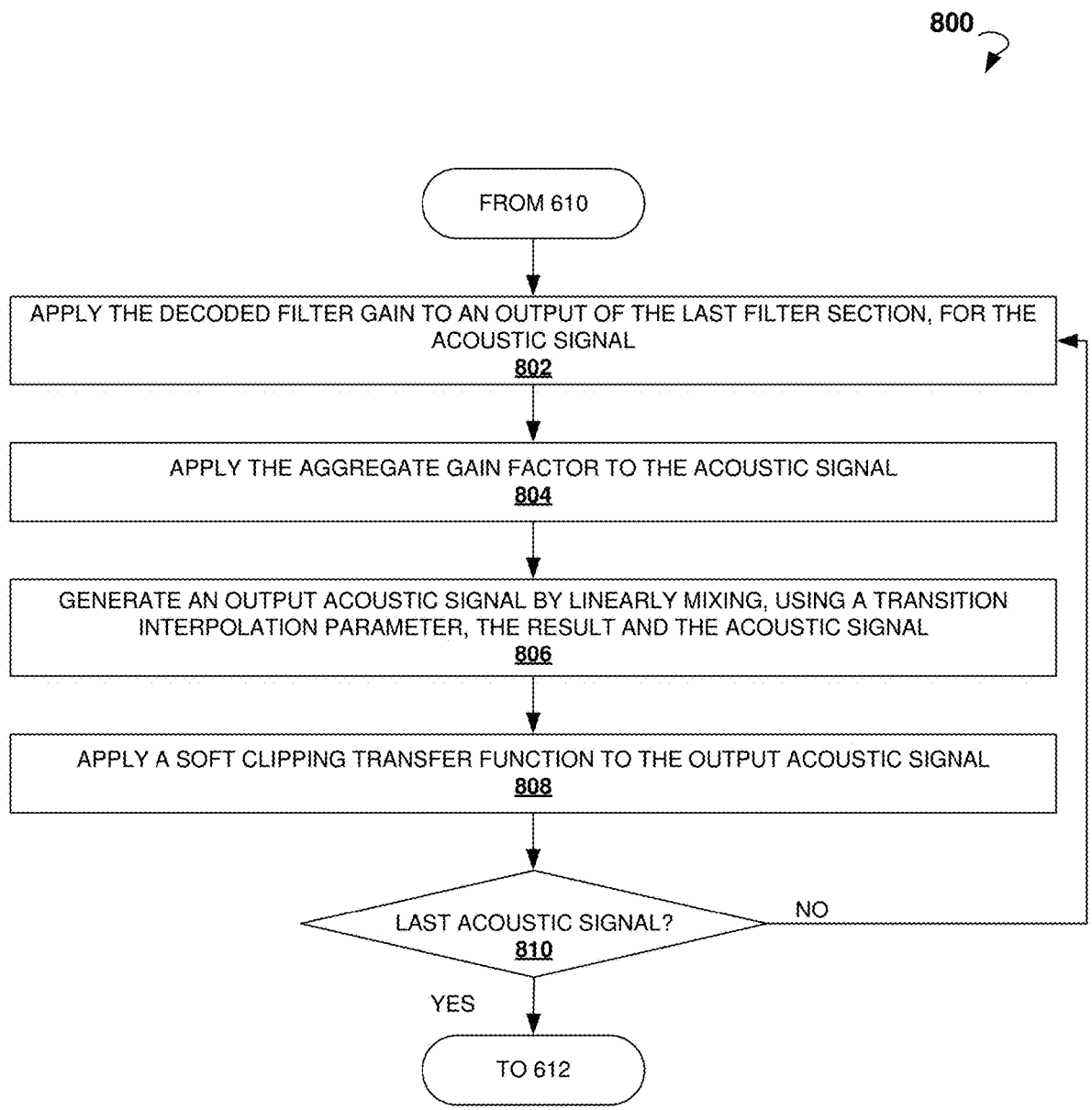
FIG. 8 is a flow chart of an exemplary method for applying a gain, any transition processing, and soft clipping to the filter outputs determined by the method of FIGS. 7A-7C.

FIG. 8 illustrates an exemplary method 800 for applying a gain, any transition processing, and soft clipping to the filter outputs from block 608 of FIG. 6. It is to be understood that blocks 802 through block 810 may be repeated for each acoustic signal.

In block 802, the decoded filter gain is applied to an output of the last filter section for the acoustic signal. In various embodiments, the decoded filter gain is applied by multiplying the decoded filter gain by the output of the last filter section. In block 804, an aggregated gain factor of the acoustic signal is applied to the result of block 802 by multiplying the result to the gain of the acoustic signal. In block 806, an output acoustic signal is generated by linearly mixing, using a transition interpolation parameter, the result of block 804 and the acoustic signal. The transition interpolation parameter is described in further detail with respect to FIG. 9. In block 808, a soft clipping transfer function is applied to the output acoustic signal.

At decision block 810, the method 800 determines whether blocks 802 through 808 have been performed for each acoustic signal. That is, whether the acoustic signal is the last acoustic signal. Based on the determination that the acoustic signal is not the last acoustic signal, blocks 802 through block 808 are repeated for next acoustic signal.

Figure 9:
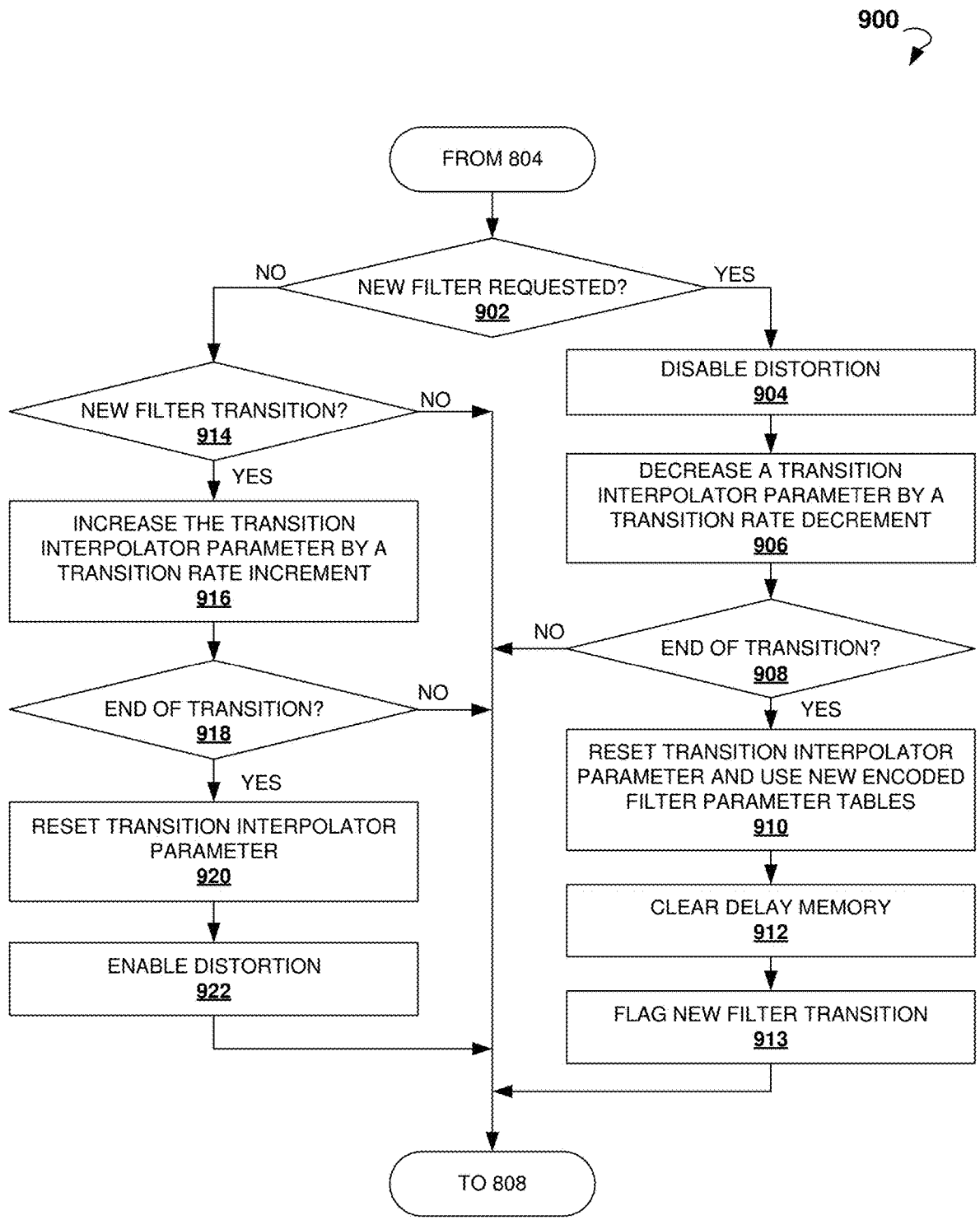
FIG. 9 is a flow chart of an exemplary method for transitioning between filters.

FIG. 9 illustrates a method 900 for transitioning between filters. For example, the user may change the currently loaded filter cube configuration. Instead of abruptly switching filter cube configurations, such as immediately switching the encoded filter parameter tables used in method 600, method 900 may be implemented after block 610 of method 600. In various embodiments, the transition includes interpolating between a first and a second cube (e.g. along a fourth dimensional axis). For example, during the transition the filter parameters may be interpolated on a sample by sample basis between the first and the second cube. Alternatively, the transition may interpolate the coefficients between the first cube and a null filter, and then interpolate coefficients between the null filter and the second cube. Moreover, a first and a second audio output may be mixed, the first audio output based on the first cube and the second audio output based on the second cube. During the transition, the digital filter module may decrease a level of the first audio output while increasing a level of the second audio output.

At decision block 902, the method 900 includes determining whether a new filter has been requested. Based on the determination that a new filter has been requested, the method 900 may proceed with block 904. In block 904, any distortion specified within either cube involved in the transition is disabled. In block 906, a transition interpolator parameter is decreased by a transition rate decrement. The transition rate decrement may be predetermined. At decision block 908, in some embodiments the method 900 determines whether the transition is completed. If the transition has completed, the method 900 may proceed to block 910 with resetting the transition interpolator parameter and using the encoded filter parameter tables associated with the new filter cube configuration. In block 912, delay memory may be cleared. In block 913, a flag is set indicating that in the subsequent iteration, there is a new filter transition.

Alternatively, based on the determination at decision block 902 that a new filter has not been requested, the method 900 may proceed to decision block 914. At decision block 914, the method 900 includes determining whether there is a new filter transition. Based on the determination that a new filter transition exists, the method 900 proceeds with block 916 and the transition interpolator parameter is increased by a transition rate increment. The transition rate increment may be predetermined.

At decision block 918, the method 900 includes determining whether the transition is completed. If the transition has completed, the method 900 proceeds to block 920 with resetting the transition interpolator parameter and block 922 with re-enabling distortion.

The multi-channel morphing digital audio filter facilitates simultaneous, real-time CV control of three dimensions to dynamically interpolate between up to eight fixed complex frequency responses. It is to be understood that methods of the present disclosure may be executed as software on an embedded processor, or may be executed on a custom chip.

In some embodiments, filter coefficients based on signal level are varied to produce a distortion. While some adaptive filters vary coefficients to remove certain undesirable signal components, the multi-channel morphing digital audio filter module may vary the filter coefficients to excessively amplify signal components. In various embodiments, the pole radius increases substantially monotonically with increasing signal level above a threshold. Other suitable implementations of distortion parameter may similarly be used.

Advantageously, in certain embodiments of the present disclosure, the system completely decouples the pole radius from the pole angle of each filter section. The user to may thus change the overtones of sound signal, or change the expression of the sound by altering harmonic content of the sound signal with the digital filters. The filters may have complicated frequency responses, which alter the frequency or amplitude of the signal. For example, a $14^{th}$ order filter will have 28 different parameters (14 different frequency parameters and 14 different amplitude parameters). It should be appreciated that interpolating a filter coefficient halfway between two frequency responses, for example, does not necessarily produce a signal that sounded halfway between the two frequency responses.

Various embodiments of the present disclosure, instead of using the traditional filter coefficients as the interpolation, decouple the frequency and the amplitude parameters. For example, the frequency of a resonance may be adjusted while the amplitude remains constant. Similarly, for example, the amplitude may be adjusted while the frequency remains the same. Furthermore, some embodiments include interpolating in the exponentially separated frequency and amplitude space. Although the present disclosure may include linearly interpolating in a linear coefficient space, that type of interpolating is specifically distinct from linearly interpolating in a logarithmic or exponential coefficient space. Thus, some embodiments of the present disclosure completely separate frequency and amplitude in the response. Furthermore, the poles may be unconditionally stable.

The multi-channel morphing digital audio filter module of the present disclosure may facilitate poles that are automatically compensated, on a sample by sample basis, such that a DC gain is fixed (e.g. at unity gain). Likewise, similar techniques may be performed on zeros of the filters. In various embodiments, methods of the present disclosure may be implemented on acoustic signals on a sample by sample basis. Additionally, the DC gain of the entire series of poles and zeros may be fixed. Moreover, a non-fixed DC gain may then be varied in real-time via an interpolated filter gain parameter.

In various embodiments, the distortion of the filter is variable and may vary in real-time. Advantageously, the filtering implements explicit algorithms which facilitate the dynamic and real-time varying of the distortion. In some embodiments, filter distortion is produced by varying the radius of the poles in response to a signal exceeding a predetermined threshold. For example, a pole radius $R_p$ can be increased by an amount equal to $R_p*(1-R_p)*(abs(V_p)-V_t)/abs(V_p)$ where $V_p$ is the signal level of the pole's real output, and $V_t$ is the distortion threshold. The signal chosen for producing the filter distortion may be the previous real output of the pole section being controlled, but likewise could be any other signal within the filter. The filter distortion may also be produced by varying the angle of the pole in response to a signal exceeding the same predetermined threshold, or alternatively a different predetermined threshold. Likewise, varying the radius and/or angle of the zeros may modify the filter distortion. Various embodiments of the present disclosure include manipulating parameters of the digital filter in an explicit way in response to a distortion onset level reaching a predetermined threshold, to produce a particular distortion effect. The distortion onset level may also describe where the distortion begins to distort, which is controlled by the user by a user input received by the digital filter module of the present disclosure. The user input may be considered an additional distinct control parameter associated with the distortion.

While the distortion parameter is identically applied to all poles in the filter, in various embodiments not all poles are affected by the distortion parameter. Alternatively, the threshold or mathematical relationship need not be the same for each pole. Likewise, coefficients of the zeros may be affected by the signal level and its relationship to a distortion threshold.

Figure 10:
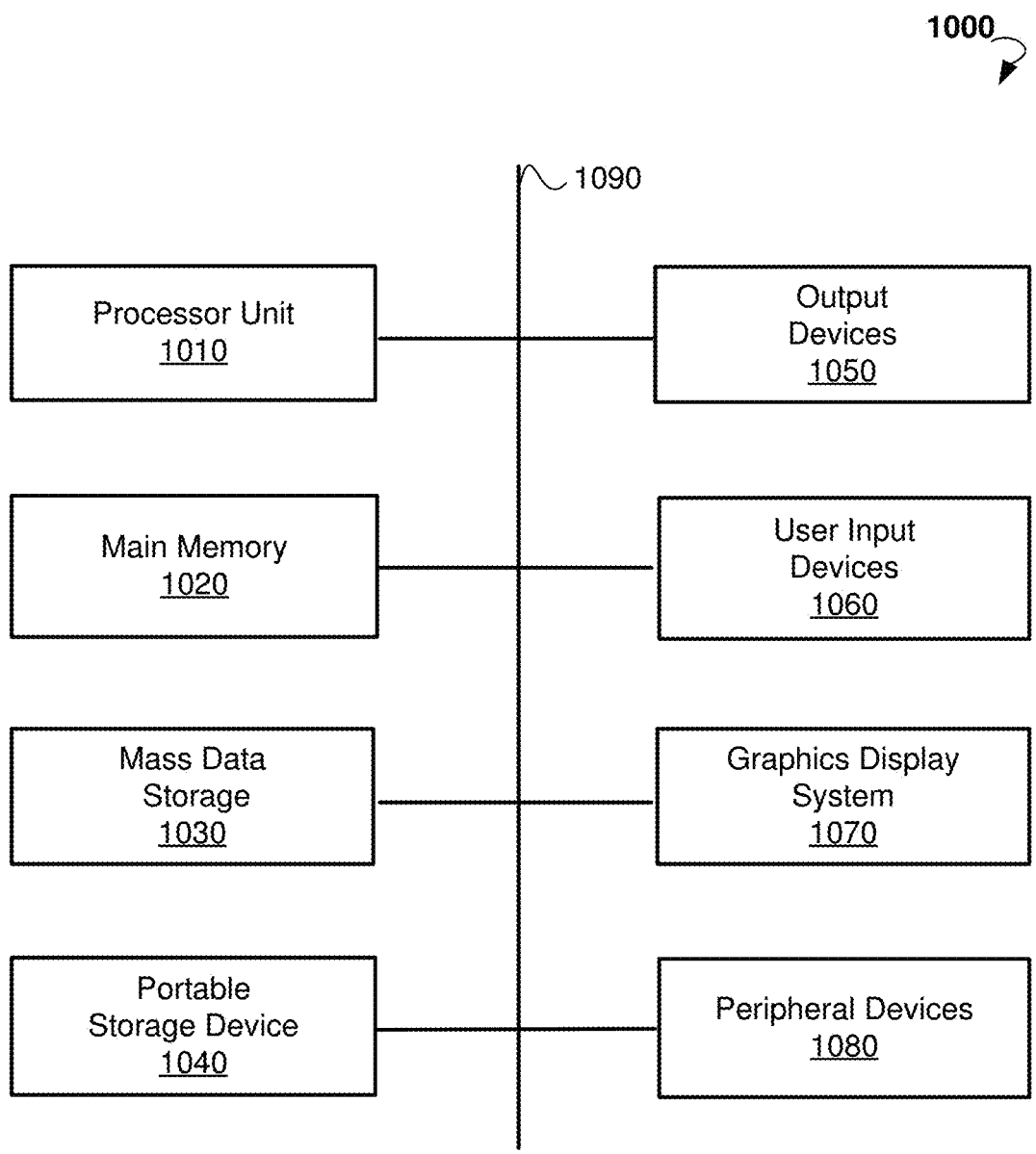
FIG. 10 is a computer system which can be used to implement methods for the present technology, according to embodiments of the present disclosure.

FIG. 10 illustrates an exemplary computer system 1000 that may be used to implement some embodiments of the present technology. Computer system 1000 may be implemented in the contexts of the likes of computing systems such as the digital filter module 100. Computer system 1000 includes one or more processor units 1010 and main memory 1020. Main memory 1020 stores, in part, instructions and data for execution by processor units 1010. Main memory 1020 stores the executable code when in operation, in this example. Computer system 1000 further includes a mass data storage 1030, portable storage device 1040, output devices 1050, user input devices 1060, a graphics display system 1070, and peripheral devices 1080.

The components shown in FIG. 10 are depicted as being connected via a single bus 1090. The components may be connected through one or more data transport means. Processor unit 1010 and main memory 1020 is connected via a local microprocessor bus, and the mass data storage 1030, peripheral device(s) 1080, portable storage device 1040, and graphics display system 1070 are connected via one or more input/output (I/O) buses.

Mass data storage 1030, which can be implemented with a magnetic disk drive, solid state drive, or an optical disk drive, is a non-volatile storage device for storing data and instructions for use by processor unit 1010. Mass data storage 1030 stores the system software for implementing embodiments of the present disclosure for purposes of loading that software into main memory 1020.

Portable storage device 1040 operates in conjunction with a portable non-volatile storage medium, such as a flash drive, floppy disk, compact disk, digital video disc, or USB storage device, to input and output data and code to and from computer system 1000. The system software for implementing embodiments of the present disclosure is stored on such a portable medium and input to computer system 1000 via portable storage device 1040.

User input devices 1060 can provide a portion of a user interface. User input devices 1060 may include one or more microphones, an alphanumeric keypad, such as a keyboard, for inputting alphanumeric and other information, or a pointing device, such as a mouse, a trackball, stylus, or cursor direction keys. User input devices 1060 can also include a touchscreen. Additionally, computer system 1000 includes output devices 1050. Suitable output devices 1050 include speakers, printers, network interfaces, and monitors.

Graphics display system 1070 include a liquid crystal display (LCD) or other suitable display device. Graphics display system 1070 is configurable to receive textual and graphical information and processes the information for output to the display device. Peripheral devices 1080 may include any type of computer support device to add additional functionality to the computer system.

The components provided in computer system 1000 are those typically found in computer systems that may be suitable for use with embodiments of the present disclosure and are intended to represent a broad category of such computer components that are well known in the art. Thus, computer system 1000 can be a personal computer (PC), hand held computer system, telephone, mobile computer system, workstation, tablet computer, mobile phone, server, minicomputer, mainframe computer, wearable computer, or any other computing system. The computer may also include different bus configurations, networked platforms, multi-processor platforms, and the like.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

In some embodiments, computing system 1000 may be implemented as a cloud-based computing environment, such as a virtual machine operating within a computing cloud. In other embodiments, computing system 1000 may itself include a cloud-based computing environment, where the functionalities of the computing system 1000 are executed in a distributed fashion. Thus, computing system 1000, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud is formed, for example, by a network of web servers that comprise a plurality of computing devices, such as computing device 1000, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media and transmission media. Non-volatile media include, for example, optical or magnetic disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications. Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASHEPROM, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A method for processing audio, comprising:
    receiving, via a digital filter module, at least one acoustic signal;
    receiving, in real-time, one or more control input signals indicative of one or more interpolator values;
    determining, based on the one or more interpolator values, one or more interpolated non-linearly encoded values by interpolating non-linearly encoded values of a plurality of fixed frequency responses, one or more frequencies and one or more resonances of each fixed frequency response being non-linearly encoded independently;
    determining one or more filter coefficients based on non-linearly decoding the interpolated non-linearly encoded values;
    generating, in real-time, a filter from the one or more determined filter coefficients;
    applying the generated filter to the at least one received acoustic signal; and
    transmitting the at least one filtered acoustic signal.

2. The method of claim 1, wherein the interpolation is performed over three axes in real-time, the one or more interpolator values include first, second, and third interpolator values.

3. The method of claim 1, wherein the non-linearly encoded values of the plurality of fixed frequency responses are logarithmically encoded, at least some of the non-linearly encoded values including zero or more pole angles, zero or more pole radii; zero or more zero angles, and zero or more zero radii of each of the fixed frequency responses, wherein each of the pole angles and each of the pole radii are indicative of a pole of the fixed frequency response and the zero angle and the zero radius are indicative of a zero of the fixed frequency response.

4. The method of claim 1, further comprising applying soft clipping to the at least one filtered acoustic signal.

5. The method of claim 3, further comprising non-linearly decoding the interpolated non-linearly encoded values from a logarithmic space to a linear space.

6. The method of claim 3, wherein the pole is unconditionally stable.

7. The method of claim 3, further comprising: if a previous real signal amplitude of the pole exceeds a distortion threshold, calculating a correction to the pole radius based on an amount by which the distortion threshold is exceeded, and applying the correction to the pole radius.

8. The method of claim 1, wherein each frequency response of the plurality of fixed frequency responses includes a one or more filter sections, the determining one or more filter coefficients being based on one or more linear interpolations of corresponding filter sections of the one or more filter sections of the plurality of fixed frequency responses.

9. The method of claim 8, further comprising, for each filter section, determining whether a pole and a zero has been specified to include direct current (DC) gain stabilization, and based on the determining, applying DC gain stabilization.

10. A digital filter module, comprising:
one or more control inputs;
a processor; and
a memory for storing executable instructions, the processor executing the instructions to:
receive, via a digital filter module, at least one acoustic signal;
receive, in real-time via the one or more control inputs, one or more control input signals indicative of one or more corresponding interpolator values;
determine, based on the one or more interpolator values, one or more interpolated non-linearly encoded values by interpolating non-linearly encoded values of a plurality of fixed frequency responses, one or more frequencies and one or more resonances of each fixed frequency response being non-linearly encoded independently;
determine one or more filter coefficients based on non-linearly decoding the interpolated non-linearly encoded values;
generate a filter from the one or more determined filter coefficients;
apply the generated filter to the at least one received acoustic signal; and
transmit the at least one filtered acoustic signal.

11. The digital filter module of claim 10, wherein the non-linearly encoded values of the plurality of fixed frequency responses are logarithmically encoded, at least some of the non-linearly encoded values including zero or more pole angles, zero or more pole radii; zero or more zero angles, and zero or more zero radii of each of the fixed frequency responses, wherein each of the pole angles and each of the pole radii are indicative of a pole of the fixed frequency response and the zero angle and the zero radius are indicative of a zero of the fixed frequency response.

12. The digital filter module of claim 11, the processor executing the instructions to further filter the one or more interpolator values with at least one of static filter coefficients and time-varying filter coefficients.

13. The digital filter module of claim 11, the processor executing the instructions to further non-linearly decode the interpolated non-linearly encoded values from a logarithmic space to a linear space.

14. The digital filter module of claim 10, the processor executing the instructions to further transition from a first set of frequency responses to a second set of frequency responses in real-time while continuously filtering the at least one received acoustic signal.

15. The digital filter module of claim 11, wherein the pole is unconditionally stable.

16. The digital filter module of claim 10, the processor executing the instructions to further distort the at least one received acoustic signal based on another control signal varied in real-time.

17. The digital filter module of claim 10, further comprising a graphical user interface configured to display, in real-time, one or more values associated with the one or more control input signals.

18. The digital filter module of claim 10, further comprising a graphical user interface configured to display, in real-time, a position of an interpolation point within a three-dimensional cube graph.

19. The digital filter module of claim 18, the graphical user interface further configured to display a real-time plot of a current frequency response of the generated filter.

20. A method, comprising:
receiving, via a digital filter module, at least one acoustic signal;
receiving, in real-time, first, second, and third control input signals indicative of first, second, and third interpolator values;
determining one or more filter coefficients, the determining comprising, for each corresponding filter section of a plurality of fixed frequency responses:
interpolating, based on the first, second, and third interpolator values and non-linearly encoded values from a plurality of non-linearly encoded filter parameter tables, the non-linearly encoded values indicative of at least one pole and at least one zero of each of the plurality of fixed frequency responses;
non-linearly decoding the interpolated non-linearly encoded values; and
calculating a section output based on the non-linearly decoded values,
the determining one or more filter coefficients further including interpolating, based on the first, second, and third interpolator values and the non-linearly encoded values from a plurality of non-linearly encoded filter parameter tables, and non-linearly decoding a non-linearly encoded value of a filter gain;
generating, in real-time, a filter from the one or more determined filter coefficients, the filter being unconditionally stable;
applying the generated filter to the at least one received acoustic signal; and
transmitting the at least one filtered acoustic signal.

* * * * *